United States Patent
Gilliland

(10) Patent No.: US 10,963,210 B2
(45) Date of Patent: Mar. 30, 2021

(54) DISTRIBUTED COMMUNICATION USING REAL-TIME POINT-TO-POINT STREAMED AUDIO IN A GAMING SYSTEM

(71) Applicant: IGT, Las Vegas, NV (US)

(72) Inventor: Sean Gilliland, South Yarra (AU)

(73) Assignee: IGT, Las Vegas, NV (US)

(*) Notice: Subject to any disclaimer, the term of this patent is extended or adjusted under 35 U.S.C. 154(b) by 286 days.

(21) Appl. No.: 15/198,282

(22) Filed: Jun. 30, 2016

(65) Prior Publication Data

US 2018/0004479 A1   Jan. 4, 2018

(51) Int. Cl.
| | | |
|---|---|---|
| G06F 3/16 | (2006.01) | |
| H04R 27/00 | (2006.01) | |
| H04L 29/06 | (2006.01) | |
| H03G 3/30 | (2006.01) | |
| G07F 17/32 | (2006.01) | |

(52) U.S. Cl.
CPC .......... *G06F 3/165* (2013.01); *G07F 17/3225* (2013.01); *H03G 3/3005* (2013.01); *H04L 65/4076* (2013.01); *H04R 27/00* (2013.01); *H04L 65/604* (2013.01); *H04R 2420/07* (2013.01); *H04R 2430/01* (2013.01)

(58) Field of Classification Search
CPC ... G06F 3/165; G07F 17/3225; H03G 3/3005; H04L 65/4076; H04L 65/604; H04R 3/04; H04R 3/12; H04R 2420/07; H04R 2430/01; H04R 27/00

See application file for complete search history.

(56) References Cited

U.S. PATENT DOCUMENTS

| | | | | |
|---|---|---|---|---|
| 6,142,872 A | * | 11/2000 | Walker | G07F 17/32 340/323 R |
| 2002/0043759 A1 | * | 4/2002 | Vancura | A63F 9/183 273/139 |
| 2008/0248865 A1 | * | 10/2008 | Tedesco | G07F 17/3248 463/25 |
| 2009/0104968 A1 | * | 4/2009 | Englman | G07F 17/32 463/20 |
| 2012/0258792 A1 | * | 10/2012 | Walther | G07F 17/32 463/26 |
| 2013/0231185 A1 | * | 9/2013 | Steil | G07F 17/3211 463/35 |
| 2015/0245172 A1 | * | 8/2015 | Fernebok | H04W 4/02 455/456.3 |
| 2017/0155751 A1 | * | 6/2017 | Vissa | H04M 1/72527 |
| 2017/0180067 A1 | * | 6/2017 | Poornachandran | H04H 20/71 |

* cited by examiner

*Primary Examiner* — Werner G Garner
(74) *Attorney, Agent, or Firm* — Sheridan Ross PC

(57) ABSTRACT

Technology for ad hoc distributed real-time communication for electronic gaming machines (EGMs) in a gaming system is disclosed. An EGM receives, via a communication network, a streamed audio data having at least one audio file from a broadcast device that was transmitted to the broadcast device as an audio signal. The EGM processes the streamed audio data to enable speakers on the EGM to broadcast the streamed audio data. The EGM broadcasts the streamed audio data using speakers on the EGM. The speakers on the EGMs are part of a distributed speaker system associated with the broadcast device in the gaming system. The EGM dynamically adjusts a volume of a plurality of audio sounds associated with a wagering game funded via the payment accepter on the EGM during the broadcasting of the streamed audio data.

20 Claims, 8 Drawing Sheets

DISTRIBUTED COMMUNICATION USING REAL-TIME POINT-TO-POINT STREAMED AUDIO IN A GAMING SYSTEM

BACKGROUND OF THE INVENTION

Copyright Notice

A portion of the disclosure of this patent document contains or may contain material, which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever.

FIELD OF THE INVENTION

The present invention relates in general to gaming devices and systems, and more particularly to distributed communication using real-time point-to-point streamed audio in a gaming system.

DESCRIPTION OF THE RELATED ART

Games of chance have been enjoyed by people for many years and have undergone increased and widespread popularity in recent times. As with most forms of entertainment, some players enjoy playing a single favorite game, while others prefer playing a wide variety of games. In response to the diverse range of player preferences, gaming establishments commonly offer many types of electronic games. Many electronic gaming machines (EGMs), such as slot machines and video poker machines, have been a cornerstone of the gaming industry for several years. The EGMs are computer based and contain multiple external interfaces for connecting with external devices and mobile devices.

SUMMARY OF THE DESCRIBED EMBODIMENTS

A current challenge for gaming institutions, in view of increasingly popular use by players, and an increasing number of electronic gaming machines (EGM) and the like in gaming environments, is advantageously providing one or more EGMs, especially microprocessor-based gaming machines that store gaming programs for operating and using the EGM, with the flexibility and capabilities of receiving customized announcement messages for an entire gaming network system and/or to one or more individual gaming patrons. Current broadcast systems are less efficient and may not be communicatively networked with one or more EGMs, particularly due to security protocols, gaming laws, and/or gaming architecture restrictions. Thus, many audio communications may be unclear due to many broadcast communication devices being remotely located from the EGMs, broadcast communication devices failing to be in close proximity to an intended gaming patron audience, and/or the audio communications may be in competition with audio sounds associated with a wage game installed on the EGM. Thus, a need exists to provide a distributed speaker system equipped within one or more EGMs to provide point-to-point ad hoc and push-to-talk distributed real-time communications for a plurality of electronic gaming machines (EGMs) networked together in a gaming system.

To address these aforementioned needs, in one embodiment, by way of example only, various embodiments are provided to provide ad hoc and push-to-talk distributed real-time communication for a plurality of electronic gaming machines (EGMs) in a gaming system is disclosed. An EGM receives, via a communication network, a streamed audio data having at least one audio file from a broadcast device that was transmitted to the broadcast device as an audio signal. The EGM processes the streamed audio data at the plurality of EGMs to enable one or more speakers on each one of the plurality of EGMs to broadcast the streamed audio data. The EGM broadcasts the streamed audio data using the one or more speakers on the EGM. The one or more speakers on the plurality of EGMs are part of a distributed speaker system associated with the broadcast device in the gaming system. The EGM dynamically adjusts a volume of a plurality of audio sounds associated with a wagering game funded via the payment accepter on each one of the plurality of EGMs during the broadcasting of the streamed audio data.

The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
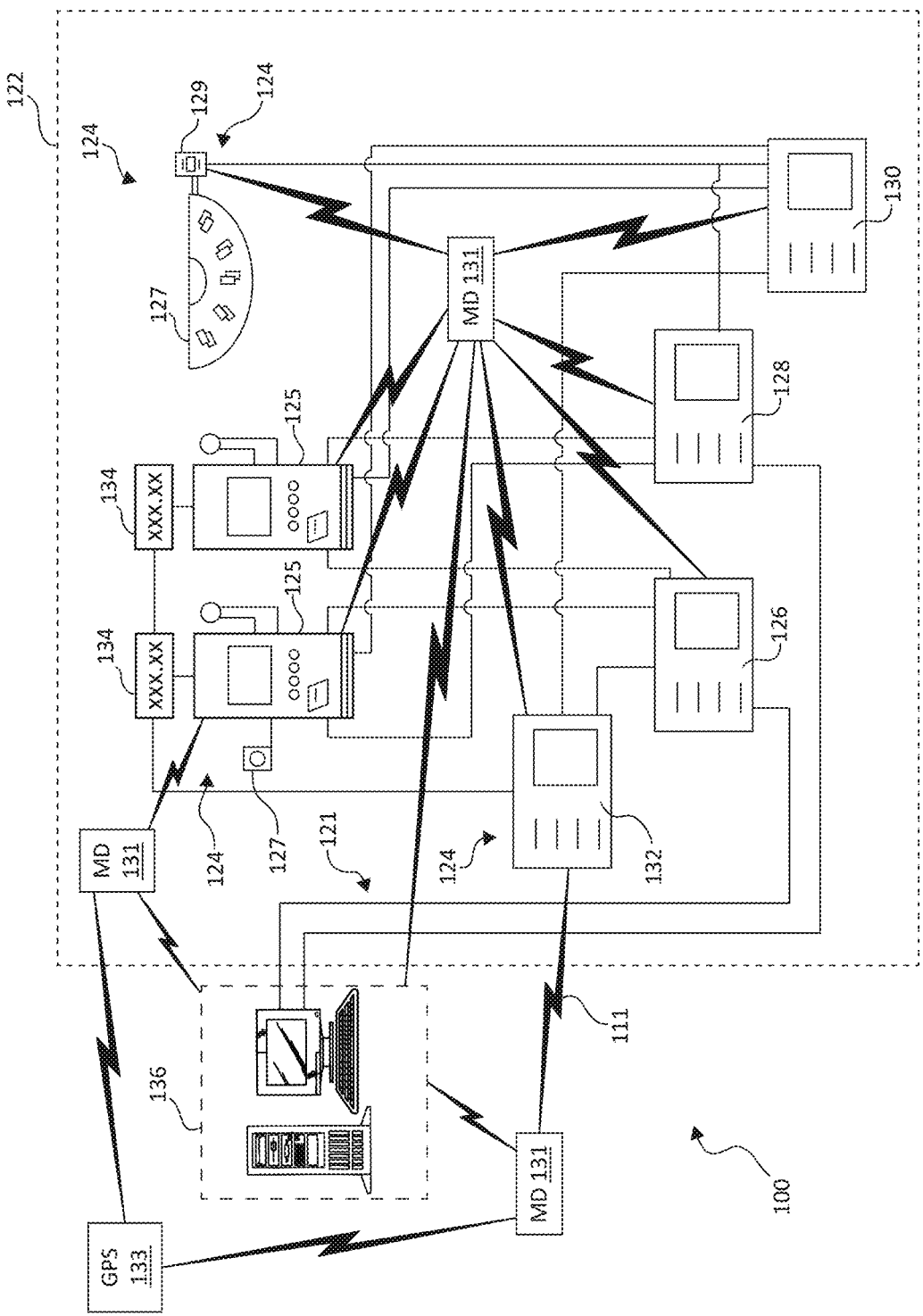
FIG. 1 is a block diagram illustrating a gaming system environment with a gaming terminal data repository (GTDR) connected via one or more network interface(s) to a gaming network which, for example, may include gaming devices (e.g., gaming terminals), in which aspects of the present invention may be realized.

In general, gaming machines require a player to place or make a wager to activate a primary or base game. The award may be based on the player obtaining a winning symbol or symbol combination and on the amount of the wager (e.g., the higher the wager, the higher the award). Symbols or symbol combinations that are less likely to occur usually provide higher awards. In such gaming machines, the amount of the wager made on the base game by the player may vary. For instance, a gaming machine may allow the player to wager a minimum number of credits, such as one credit (e.g., one penny, nickel, dime, quarter or dollar) up to a maximum number of credits, such as five credits. The player may make this wager a single time or multiple times in a single play of a primary game. For instance, a slot game may have one or more pay lines and the slot game may allow the player to make a wager on each pay line in a single play of the primary game. Slot games with 1, 3, 5, 9, 15 and 25 lines may be provided. Thus, a gaming device, such as a slot game, may allow players to make wagers of substantially different amounts on each play of the primary or base game ranging, for example, from one credit up to 125 credits (e.g., five credits on each of 25 separate pay lines). This is also true for other wagering games, such as video draw poker, where players can wager one or more credits on each hand and where multiple hands can be played simultaneously. Different players play at substantially different wagering amounts or levels and at substantially different rates of play.

Secondary or bonus games may also be provided in the gaming machines. The secondary or bonus games may provide an additional award to the player. Secondary or bonus games may not require an additional wager by the player to be activated. Secondary or bonus games may be activated or triggered upon an occurrence of a designated triggering symbol or triggering symbol combination in the primary or base game. For instance, a bonus symbol occurring on the pay line on the third reel of a three-reel slot machine may trigger the secondary bonus game. When a secondary or bonus game is triggered, the gaming machines may indicate this to the player through one or more visual and/or audio output devices, such as the reels, lights, display units, speakers, video screens, etc. Part of the enjoyment and excitement of playing certain gaming machines is the occurrence of the secondary or bonus game (even before the player knows how much the bonus award will be). In other words, obtaining a bonus award is part of the enjoyment and excitement for players.

Progressive awards may also be provided in gaming machines. A progressive award may be an award amount that includes an initial amount funded by a casino and an additional amount funded through a portion of each wager made on the progressive gaming machine. For example, 1% to 5% of each wager placed on the primary game of the gaming machine associated with the progressive award may be allocated to the progressive award or progressive award fund. The progressive award grows in value as more players play the gaming machine, and thus, portions of these players' wagers are allocated to the progressive award. When a player obtains a winning symbol or symbol combination, which results in the progressive award, the accumulated progressive award is provided to the player. After the progressive award is provided to the player, the amount of the next progressive award may be reset to an initial value, a predetermined value, or randomly generated value, and a portion of each subsequent wager on a gaming machine associated with the progressive is allocated to the next progressive award as described above.

A progressive award may be associated with a single gaming machine or multiple gaming machines which each contribute portions of the progressive award. The multiple gaming machines may be in the same bank of machines, in the same casino or gaming establishment (usually through a local area network ("LAN")) or in two or more different casinos or gaming establishments (usually through a wide area network ("WAN")). Such progressive awards are sometimes called local area progressive ("LAP") and wide area progressive ("WAP"), respectively. Progressive awards may increment through communication between a progressive controller and one or more gaming machines. The gaming machines associated with the progressive award transfer coin-in information to a progressive controller. From this information, the progressive controller calculates how much to increment the progressive award based on a set increment rate and then increments the progressive award accordingly. The gaming machines may provide the player a choice between different wager levels prior to the commencement of a primary game. The different wager levels enable the player to win different progressive awards. The gaming devices provide a progressive jackpot where the value of the jackpot may increase by a particular amount for every game played. Thus, when multiple gaming devices are linked together to form one large progressive jackpot, the jackpot grows more quickly because multiple players are contributing to the jackpot at the same time.

Each gaming venue may include one or more gaming machines to allow a player to experience each of the various types of wage games and game awards. However, during the course of the use of the gaming machines and/or when a non-gaming person may be in close proximity to the gaming machines, a Casino operator or administrator may desire to interrupt the use of the gaming machine and issue a public service announcement. Current broadcast systems are less efficient and may not be communicatively networked with one or more EGMs, particularly due to security protocols, gaming laws, and/or gaming architecture restrictions. Thus, many audio communications may be unclear due to many broadcast communication devices being remotely located from the EGMs, broadcast communication devices failing to be in close proximity to an intended gaming patron audience, and/or the audio communications may be in competition with audio sounds associated with a wage game installed on the EGM. Thus, a need exists to provide a distributed speaker system equipped within one or more EGMs to provide point-to-point ad hoc and push-to-talk distributed real-time communications for a plurality of electronic gaming machines (EGMs) networked together in a gaming system.

To address these aforementioned needs, in one embodiment, by way of example only, various embodiments are provided to provide ad hoc and push-to-talk distributed real-time communication for a plurality of electronic gaming machines (EGMs) in a gaming system. The EGM can include a device that communicates with a payment acceptor (e.g., a bill acceptor or printer) to simulate bills and tickets.

The EGM may have a device (software and/or hardware) that communicates with a back end host that ultimately uses slot account system (SAS) or game-to-system (G2S) to move the money to and from the particular and identified EGM. This configuration allows all of EGMs to be retrofitted for mobile payments. In one aspect, upon funding a bet and/or during non-wage gaming operations (e.g., a display of the EGM offering promotions, illustrations of sample wage games, and/or other gaming and/or non-gaming operations, an EGM can receive, via a communication network, a streamed audio data having at least one audio file from a broadcast device that was transmitted to the broadcast device as an audio signal.

In one aspect, a microphone and/or other computing device configured with circuitry to generate an audio signal, such as, for example, a microphone, personal computer, a Personal Electronic Device (PED) (e.g., mobile device), a smart phone, etc., can be used to generate an audio signal that can be sent to the broadcast device. The broadcast device can be a gaming server, a communication system, a personal computer, a Personal Electronic Device (PED) (e.g., mobile device), a smart phone, which can generate, decode, and/or receive audio signals and/or audio files. The EGM can process the streamed audio data at the plurality of EGMs to enable one or more speakers on each one of the plurality of EGMs to broadcast the streamed audio data. The EGM broadcasts the streamed audio data using the one or more speakers on the EGM. The one or more speakers on the plurality of EGMs are part of a distributed speaker system associated with the broadcast device in the gaming system. The EGM can dynamically adjust a volume of a plurality of audio sounds associated with a wagering game funded via the payment accepter on each one of the plurality of EGMs during the broadcasting of the streamed audio data.

In one embodiment, the wireless communication for transmitting the audio signals and/or audio files may go directly to a processing unit on a particular and identified EGM. The EGM may be configured with a software and/or hardware device that communicates with the broadcast device.

Turning now to FIG. 1, a block diagram illustrating a gaming system environment 100 is shown. Environment 100 includes a Gaming Terminal Data Repository (GTDR) connected via one or more network interface(s) to a gaming network which, for example, may include gaming devices (e.g., gaming terminals) and/or other devices, in which aspects of the present invention may be realized. As illustrated in FIG. 1, the gaming environment 100 may comprise a gaming system/environment 122 located in a physical environment (not shown). It will be appreciated that the communications links between the various components may be separate and distinct or may be commonly used. It will also be appreciated that one or more of the functions or applications described above may be consolidated, such as at a common server or host. Further, other components for implementing other functionality may be provided. For example, a variety of computing devices, such as user stations, may be connected to the various systems. Printers and other peripheral devices may also be connected to each network or system. A gaming system/environment 122 may be located at least partially in one or more physical gaming environments, such as a casino, restaurant, and/or convenience store. For example, the casino may include publicly accessible game areas where certain of the gaming system devices 124, such as gaming machines 125 and table games 127, are located, as well as secure areas where the servers and other components are located.

In one embodiment, the physical environment includes at least a portion of a physical structure, such as a casino, housing one or more components of the gaming system/environment 122. The gaming system/environment 122 includes one or more gaming system devices 124 or components. The gaming system devices 124 may include gaming machines 125, such as those known as video or slot machines. The devices 124 may also include "table" games 127 such as Blackjack and Roulette. The gaming devices 124 may also include components or devices such as player tracking card readers 129, coin counters and other gaming devices functionality options, which devices or components may be linked or associated with other devices. The devices or components may also comprise computers or servers and communication equipment, cashier and accounting workstations and a wide variety of other elements.

In one embodiment, the gaming system/environment 122 may include a variety of sub-systems. These sub-systems may be partially or fully independent of one another or may be related. In one embodiment, each system may be included or be part of a network. In one embodiment, the gaming system/environment 122 may include a game presentation/operation system, which includes at least one game server 126. The game server 126 may comprise a computing device including a processor and a memory. The game server 126 may be adapted to perform a variety of functions. This functionality may be implemented by software and/or hardware of the server 126. In one embodiment, the game server 126 may be arranged to provide information or instructions to the one or more gaming devices 124 or individual gaming system components. The information may comprise game code and control data. In one embodiment, the game server 126 may also be arranged to accept information from the gaming devices 124 or components. For example, the game server 126 may accept information regarding the status of operation of a particular gaming system device 124 (such as "normal" or "malfunction").

In one embodiment, the game server 126 is part of a network, which includes a communication link between the game server 126 and selected gaming system device(s) 124 and/or other component(s) with which communication is desired. A communication interface may be associated with the game server 126 and each device or component for facilitating the communication. The communication interfaces may have a variety of architectures and utilize a variety of protocols such as IEEE-1394 (FireWire™) or Ethernet in the case where the communication link is a wired link, or a wireless link utilizing a wireless protocol such as WIFI, Bluetooth™, Radio Frequency (RF), Infrared, etc. The communication links may transmit electrical, electromagnetic or optical signals, which carry digital data streams, or analog signals representing various types of information. In one embodiment, such as when the gaming device 124 comprises a gaming machine 125, the device 124 may include a master gaming controller, which controls the functions of game operation. The communication interface may be associated with the master gaming controller, permitting data to be transmitted between the game server 126 and the master gaming controller.

In one embodiment, the gaming system/environment 122 may include a player tracking system, which includes at least one player-tracking server 128. The player-tracking server 128 may also comprise a computing device including a processor and a memory. The player-tracking server 128 may be adapted to perform player-tracking functions. For example, the player-tracking server 128 may store information regarding the identities of players and information regarding the game play of those players. This information may include time of play, coin in/coin out or other monetary transaction data, and in an arrangement where players are awarded points based on play, a player's point total. Once again, the player tracking system includes a network comprising a communication link provided between the player tracking server 128 and one or more of the gaming devices 124 having a player tracking function or other components of the gaming system/environment 122 associated with the system. In one embodiment, such as where the gaming device 124 comprises a gaming machine, the device may include a management interface board, which controls a card reader. The management interface board may be arranged to receive data from the master gaming controller of the gaming system device 124. A communication interface is associated with the management interface board, permitting data to be transmitted between the player tracking server 128 and the management interface board.

In the case of table games, a card reader 129 may be associated with the table (e.g., the card reader located on or near the table game). Players may utilize the card reader to identify themselves. Information regarding play of the table game may be input through an input device by a dealer, coin counter or the like, and this information may be transmitted to the player tracking server 128.

In one embodiment, the gaming system/environment 122 may include an accounting system, which includes at least one accounting server 130. The accounting server 130 may comprise a computing device including a processor and a memory. The accounting server 130 is preferably adapted to perform financial related functions, such as track financial transactions such as bets and payouts, and perform reconciliations with monies collected from the gaming system devices 124, such as gaming machines 125, tables games 127. The accounting server 130 may be associated with a wide variety of devices, including individual gaming system devices 124 and other servers. Once again, a communication link may be provided between the accounting server 130 and each device with which communications is desired.

In one embodiment, the gaming system/environment 122 may include a progressive award system, which includes at least one progressive server 132. The progressive sever 132 may comprise a computing device including a processor and a memory. The progressive server 132 may be designed to generate progressive award information. In one arrangement, the progressive server 132 may obtain information regarding amounts bet at specific gaming system devices 124, such as gaming machines 125 or table games 127. Utilizing this information, a progressive jackpot award amount may be generated and updated using a specified protocol. The information may be transmitted to one or more displays 134 associated with participating devices 124. Once again, a communication link is preferably provided between the progressive server 132 and each device with which communications is desired. For example, a link may be provided between the progressive server 132 and accounting server 130 for providing payout information to the accounting server 130. The accounting server 130 also reads the paid amounts from the electronic gaming machines 125 as well and makes sure the paid amounts match what the progressive server claimed the paid amounts should have been. If the paid amounts do not match, then the accounting server 130 may raise a flag for further investigation by casino staff or regulators.

A physical and/or virtual information host 136 is associated with or comprises a portion of the gaming system/environment 122. In one embodiment, the host 136 comprises a computing device, which includes a processor, memory and a display. The virtual information host 136 may be one or more devices separate from devices performing other functions of the system/environment 122, or may be integrated with existing devices. The virtual information host 136 may be designed and adapted to perform functions relating to acquiring, managing, rendering, generating and/or displaying real-time and/or non real-time casino gaming system or "gaming environment" graphical information and information regarding one or more components of the gaming system or environment. Such functionality may also include the generation of at least one graphical user interface on at least one mobile device (e.g., 131), which is configured or designed to graphically display information (e.g., real-time casino information) relating to selected aspects of casino activity. Also, different graphical user interfaces may be displayed on an external application, such as on an application of a computer, smart phone, and/or on any type of mobile device 131. In one embodiment, bi-directional communication channels 121 are provided for direct, two-way communication between the host 136 and at least one game server 126 and at least one player-tracking server 128, and/or any other device with which communications is desired.

As illustrated in the example of FIG. 1, gaming system/environment 122 may also include one or more mobile devices 131 configured or designed to communicate, via one or more wireless links 111, with various components of the gaming environment 100 such as, for example: information systems (e.g., virtual information host 136); player tracking systems; accounting systems; employee management systems; location positioning systems (e.g., GPS system 133); game servers; surveillance systems; security systems; communications systems; gaming systems (e.g., gaming machines 125, game table devices 127, other mobile devices 125, etc.); etc.

Figure 2:
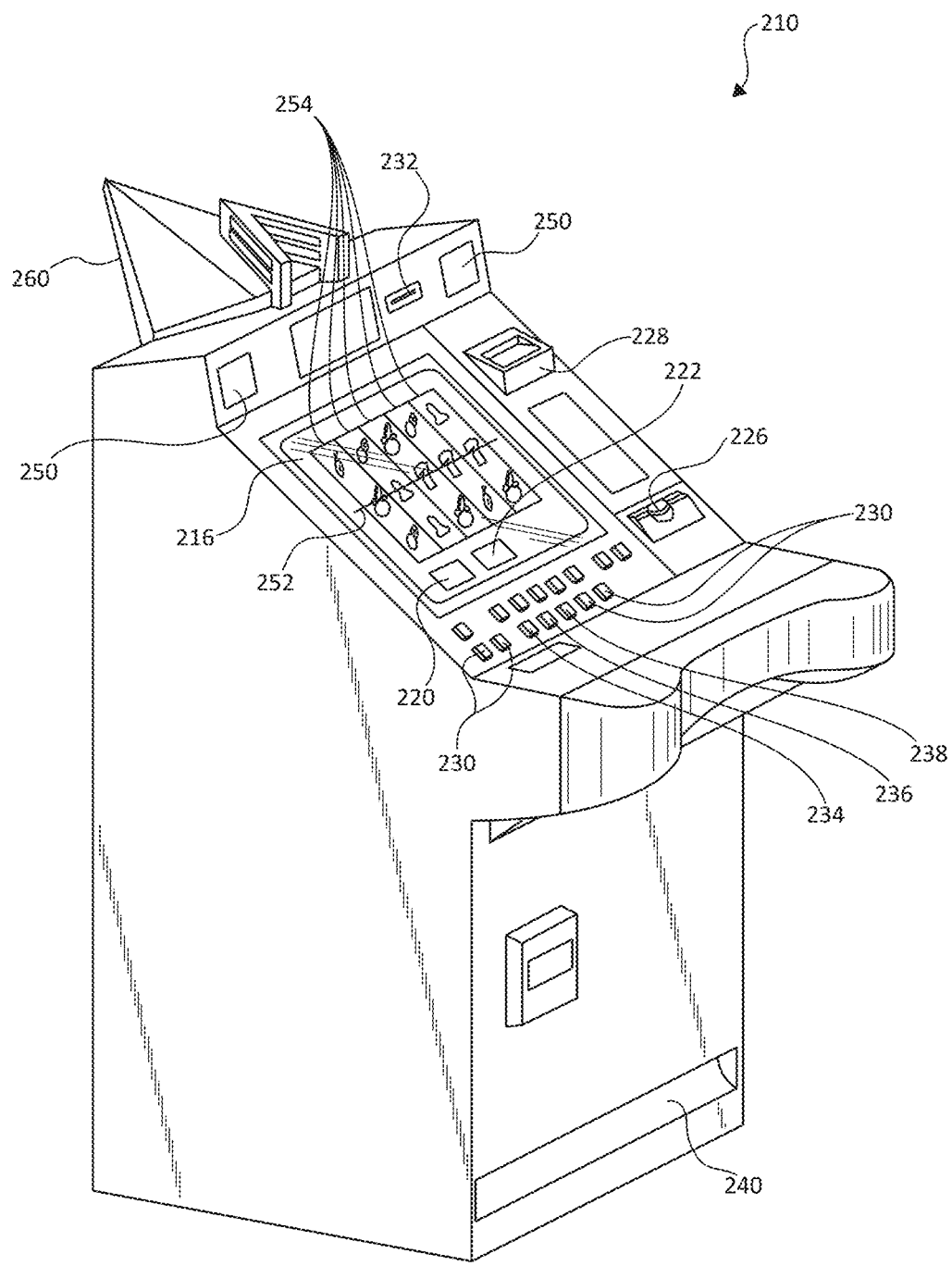
FIG. 2 is a perspective view of one embodiment of a slot machine or gaming device suitable for use in the gaming system of FIG. 1, in which aspects of the present invention may be realized.

FIG. 2 is a perspective view of one embodiment 210 of a slot machine, EGM, or gaming device suitable for use in the previously depicted system of FIG. 1, in which aspects of the present invention may be realized. FIG. 2 represents a base gaming device 210 that can be employed in the shared display system or the gaming system of the present invention is illustrated as gaming device 210. FIG. 2 illustrates features common to each of the gaming devices. In one embodiment, gaming device 210 has a support structure, housing or cabinet, which provides support for a plurality of displays, inputs, controls and other features of a conventional gaming machine. In the illustrated embodiment, the player plays gaming device 210 while sitting, however, the gaming device is alternatively configured so that a player can operate it while standing or sitting. The illustrated gaming device 210 is positioned on the floor but can be positioned alternatively (i) on a base or stand, (ii) as a pub-style table-top game (e.g., where the participant gaming devices are located remotely from the shared wheel as discussed below), (iii) as a stand-alone gaming device on the floor of a casino with other stand-alone gaming devices, which the player operates while standing or sitting (e.g., where the participant gaming devices are located remotely from the shared wheel as discussed below), or (iv) in any other suitable manner. The gaming device 210 can be constructed with varying cabinet and display configurations. Also, referring to an embodiment for the electronic configuration of gaming device 210, each gaming device may include the components described below in FIG. 3A and FIG. 3B.

In one embodiment, each gaming device 210 randomly generates awards and/or other game outcomes based on probability data. That is, each award or other game outcome is associated with a probability and each gaming device generates the award or other game outcome to be provided to the player based on the associated probabilities. Since each gaming device 210 generates outcomes randomly or based upon a probability calculation, there is no certainty that the gaming device 210 will provide the player with any specific award or other game outcome.

In another embodiment, as discussed in more detail below, each gaming device 210 employs a predetermined or finite set or pool of awards, progressive awards, prizes or other game outcomes. As each award or other game outcome is provided to the player, the gaming device 210 removes the provided award or other game outcome from the predetermined set or pool. Once removed from the set or pool, the specific provided award or other game outcome cannot be provided to the player again. The gaming device 210 provides players with all of the available awards or other game outcomes over the course of the play cycle and guarantees a designated amount of actual wins and losses.

Figure 3A:
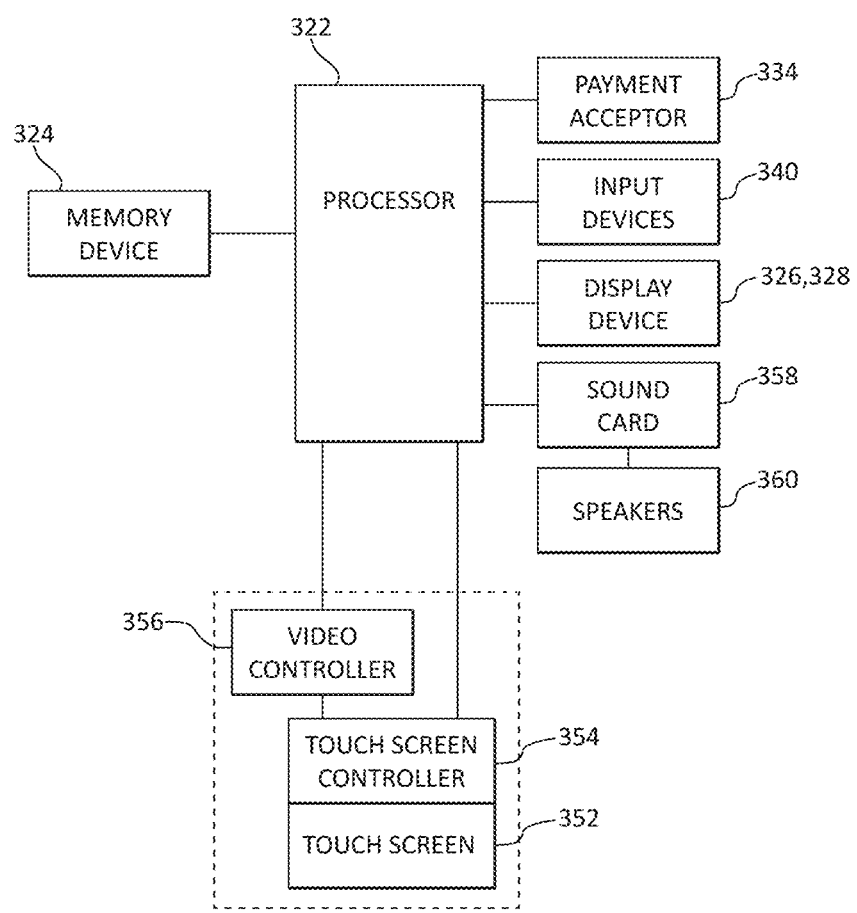
FIG. 3A is a block diagram illustrating an electronic configuration for use in the gaming device of FIG. 2, in which aspects of the present invention may be realized.

As seen in FIG. 2, the gaming device 210 includes a credit display 220 that displays a player's current number of credits, cash, account balance or the equivalent. In one embodiment, gaming device 210 includes a bet display 222 that displays a player's amount wagered. As illustrated in FIG. 3A, in one embodiment, each gaming device 210 includes at least one payment acceptor 334 (FIG. 3A) that communicates with processor 322 (FIG. 3A).

As seen in FIG. 2, the payment acceptor 334 (FIG. 3A) in one embodiment includes a coin slot 226, where the player inserts coins or tokens, and a ticket, note or bill acceptor 228, where the player inserts a bar-coded ticket, note, or cash. In one embodiment, a player-tracking card, credit card, debit card or data card reader/validator 232 is also provided for accepting any of those or other types of cards.

In one embodiment, a player inserts an identification card into card reader 232 of gaming device 210. The identification card can be a smart card having a programmed microchip or a magnetic strip coded with a player's identification, credit totals and other relevant information. In one embodiment, money may be transferred to gaming device 10 through an electronic fund transfer and card reader 232 using the player's credit, debit or smart card. When a player funds gaming device 210, processor 322 (FIG. 3A) determines the amount of funds entered and the corresponding amount is shown on the credit or other suitable display as described above. In one embodiment, after appropriate funding of gaming device 210, the player presses a play button 234 or pull arm (not illustrated) to start any primary game or sequence of events. In one embodiment, upon appropriate funding, gaming device 210 begins game play automatically. In another embodiment, the player needs to actuate or activate one of the play buttons to initiate play of gaming device 210.

As shown in FIG. 2, a bet one button 236 is provided. The player places a bet by pushing bet one button 236. The player increases the player's wager by one credit each time the player pushes bet one button 236. When the player pushes the bet one button 236, the number of credits shown in the credit display 220 decreases by one, and the number of credits shown in the bet display 222 increases by one. A max bet max button (not shown) can also be provided, which enables the player to bet the maximum wager (e.g., max lines and max wager per line). Gaming device 210 may include other suitable wager buttons 230, such as a max bet button, a repeat bet button, one or more select pay lines buttons and one or more select wager per pay line buttons.

In one embodiment, a cash out button 238 is provided. The player presses cash out button 238 and cashes out to receive a cash payment or other suitable form of payment corresponding to the number of remaining credits. The player can receive coins or tokens in a coin payout tray 240 or a ticket or credit slip, which are redeemable by a cashier or funded to the player's electronically recordable identification card. Each gaming device 210 also includes one or a plurality of communication ports for enabling communication of a processor with one or more external peripherals, such as external video sources, expansion buses, expansion games or other displays, an SCSI port or a key pad.

In one embodiment of FIG. 2, in combination with in FIG. 3A, a touch-screen 352 (FIG. 3A) is provided in one embodiment and operates with a touch-screen controller 354, processor 322 (FIG. 3A) and display device 326, 328 (FIG. 3A). Touch-screen 352 (FIG. 3A) and the touch-screen controller 354 are also connected to a video controller 356. The player touches touch-screen 352 at appropriate places to input decisions and signals into processor 322 of gaming device 210. Also, each gaming device 210 may include a sound generating device controlled by one or more sounds cards 258, which function in conjunction with processor 322 (FIG. 3A). In one embodiment, the sound generating device includes at least one speaker 250 or other sound generating hardware and/or software for generating sounds, such as playing music for the primary and/or secondary game or for other modes of the gaming device, such as an attract mode. In one embodiment, each gaming device 210 provides dynamic sounds coupled with attractive multimedia images displayed on display device 216 to provide an audio-visual representation or to otherwise display full-motion video with sound to attract players to gaming device 210. During idle periods, the gaming device 210 displays a sequence of audio and/or visual attraction messages to attract potential players to gaming device 210. The videos in one embodiment are customized to provide information concerning the shared display of the present invention as discussed below.

In one embodiment, gaming device 210 includes a camera in communication with a processor, which is positioned to acquire an image of a player playing gaming device 210 and/or the surrounding area of gaming device 210. In one embodiment, the camera may be configured to selectively acquire still or moving (e.g., video) images and may be configured to acquire the images in either an analog, digital or other suitable format. Display device 216 may be configured to display the image acquired by the camera as well as display the visible manifestation of the game in split screen or picture-in-picture fashion. For example, the camera may acquire an image of the player and that image can be incorporated into the primary and/or secondary game as a game image, symbol or indicia.

In one embodiment, as illustrated in FIG. 2, a base or primary game includes a slot game with one or more pay lines 252. Pay lines 252 may be horizontal, vertical, circular, diagonal, angled or any combination thereof. For a slot game, gaming device 210 displays at least one reel and preferably a plurality of reels 254, such as three to five reels, in either electromechanical form with mechanical rotating reels or in video form with simulated reels and movement thereof. Each reel 254 displays a plurality of indicia such as bells, hearts, fruits, numbers, letters, bars or other images, which preferably correspond to a theme associated with the gaming device. With a slot game, gaming device 10 awards prizes when reels 254 stop spinning and display a winning or paying symbol or combination of symbols on an active pay line 252.

In one embodiment, each gaming device 210 includes indicators 260. Indicators 260 reside on the top of each gaming device 210 and point to or indicate one of the awards or outcomes on top of shared display (not shown) when the shared display stops spinning to reveal randomly or otherwise generated results or outcomes. Indicators 260 may illuminate differently at different times or states for the gaming device 210. The illumination of the indicator 260 in one embodiment depends upon whether the gaming device 210 is playing a base game, is in a state in which the player is eligible to play the shared display bonus, is in a state in which the player has committed to play the shared display bonus or is in a state in which the player has declined to play a particular upcoming shared display bonus, as well as other states discussed below.

FIG. 3A is a block diagram illustrating an electronic configuration for use in the gaming device of FIG. 2, here again in which aspects of the present invention may be realized. In the embodiment illustrated in FIG. 3A the player station may include at least one processor 322, such as a microprocessor, a microcontroller-based platform, a suitable integrated circuit or one or more ASICs. The processor 322 is in communication with or operable to access or to exchange signals with at least one data storage or memory device 324. In one embodiment, the processor 322 and the memory device 324 reside within the cabinet of the player station. The memory device 324 stores program code and instructions, executable by the processor 322, to control the player station. The memory device 324 also stores other data such as image data, event data, player input data, random or pseudo-random number generators, pay-table data or information and applicable game rules that relate to the play of the player station. In one embodiment, the memory device 324 includes random access memory (RAM), which can include non-volatile RAM (NVRAM), magnetic RAM (MRAM), ferroelectric RAM (FeRAM) and other forms as commonly understood in the gaming industry. In one embodiment, the memory device 324 includes read only memory (ROM). In one embodiment, the memory device 324 includes flash memory and/or EEPROM. Any other suitable magnetic, optical and/or semiconductor memory may operate in conjunction with the player station and gaming system disclosed herein.

In one embodiment, part or all of the program code and/or operating data described above can be stored in a detachable or removable memory device, including, but not limited to, a suitable cartridge, disk, CD ROM, DVD or USB memory device. In other embodiments, part or all of the program code and/or operating data described above can be downloaded to the memory device through a suitable network.

In one embodiment, an operator or a player can use such a removable memory device in a desktop computer, a laptop personal computer, a personal digital assistant (PDA), portable computing device, or other computerized platform to implement the present disclosure. In one embodiment, the gaming system is operable over a wireless network, such as part of a wireless gaming system. In this embodiment, the player station may be a hand held device, a mobile device or any other suitable wireless device that enables a player to play any suitable game at a variety of different locations. It should be appreciated that a player station as disclosed herein may be a device (e.g., EGM) that has obtained approval from a regulatory gaming commission or a device that has not obtained approval from a regulatory gaming commission. It should be appreciated that the processor and memory device may be collectively referred to herein as a "computer" or "controller."

In one embodiment, a background play feature may be available where a player, who may be sitting at the lounge and/or at the bar with friends (at the casino) may be playing a machine from the floor by remote via the external application (e.g., a smart phone). The player may substitute into the same game he wanted from a Gaming Vendor online game and play, or backend the actual game though a venue network. The game may be bankrolled by the venue the player was inside. If the player was to win the player could collect from that venue where the player was located, and/or instead of "reserving" a machine he could continue the game with an auto play during a period of time the player took a break/recess. In one embodiment, a team game may be played by a group of players (e.g., a group of 3 or 4 players) and the group of players may watch and/or play the same game on each players individual external device (e.g., a computer and/or smart phone). Similarly, as described above, the team game may be played by a group of players from a remote location (e.g., bar, lounge, casino, home, office, restaurant, etc.). In one embodiment, the team game may be played by a group of players and the group of players may share credit inputs and wins. In one embodiment, the team game may be played by the group of players and the group of players may sell off and/or share double up options and/or credits to others team players of the group.

In one embodiment, as discussed in more detail below, the gaming device randomly generates awards and/or other game outcomes based on probability data. In one such embodiment, this random determination is provided through utilization of a Random Number Generator (RNG), such as a true random number generator, a pseudo random number generator or other suitable randomization process. In one embodiment, each award or other game outcome is associated with a probability and the player station generates the award or other game outcome to be provided to the player based on the associated probabilities. In this embodiment, since the player station generates outcomes randomly or based upon one or more probability calculations, there is no certainty that the player station will ever provide the player with any specific award or other game outcome. In another embodiment, each award or other game outcome is associated with a probability and the central controller or server generates the award or other game outcome to be provided to the player based on the associated probabilities. In one embodiment, each of the player stations includes an RNG and the central server controls the display of the central display. It should be appreciated there may be one or more RNG's per: (a) display segment; (b) central display; (c) player station; (d) number of games; (e) the number of potential games; or (f) any combination of the above. It should also be appreciated that one or more processors may work together and communicate to accomplish any suitable function of the gaming system.

In another embodiment, the gaming system employs a predetermined or finite set or pool of awards or other game outcomes. In this embodiment, as each award or other game outcome is provided to the player, the central controller flags or removes the provided award or other game outcome from the predetermined set or pool. Once flagged or removed from the set or pool, the specific provided award or other game outcome from that specific pool cannot be provided to the player again. This type of gaming system provides players with all of the available awards or other game outcomes over the course of the play cycle and guarantees the amount of actual wins and losses.

In one embodiment, as mentioned above and seen in FIG. 3A, one input device is a touch-screen 352 coupled with a touch-screen controller 354, or some other touch-sensitive display overlay to allow for player interaction with the images on the display. The touch-screen and the touch-screen controller are connected to a video controller 356. A player can make decisions and input signals into the player station by touching the touch-screen at the appropriate places. One such input device is a conventional touch-screen button panel. In another embodiment, a plurality or each of the display segments is a touch-screen 352 coupled with a touch-screen controller 354 or some other touch-sensitive display overlay to allow for player interaction with the images on the display segments. The touch-screens 352 and the touch-screen controllers 354 are connected to a video controller. The player station may further include a plurality of communication ports for enabling communication of the processor with external peripherals, such as external video sources, expansion buses, game or other displays, an SCSI port or a key pad. In one embodiment, at least one payment acceptor 324 that communicates with processor 322 for playing a bet, input devices 340, and display devices 326, 328 are provided.

The player stations, the central controller and the display segments may include serial interfaces and/or Ethernet (e.g., G2S (game-to-system) protocol uses commodity Ethernet equipment and TCP/IP) to connect to specific subsystems or subnets internal and external to the player stations, central controller and the display segments. The serial devices may have electrical interface requirements that differ from the "standard" EIA serial interfaces provided by general-purpose computers. These interfaces may include EIA, EIA, Fiber Optic Serial, optically coupled serial interfaces, current loop style serial interfaces, etc. In addition, to conserve serial interfaces internally in the player station, serial devices may be connected in a shared, daisy-chain fashion where multiple peripheral devices are connected to a single serial channel.

The serial interfaces and/or Ethernet (e.g., G2S (game-to-system) protocol uses commodity Ethernet equipment and TCP/IP) may be used to transmit information using communication protocols that are unique to the gaming industry. For example, SAS is a communication protocol used to transmit information, such as metering information, from a player station to a remote device. Often SAS is used in conjunction with a player tracking system. EGMs may be treated as peripheral devices to a casino communication controller and connected in a shared daisy chain fashion to a single serial interface and/or Ethernet. In both cases, the peripheral devices are preferably assigned device addresses. If so, the serial controller circuitry must implement a method to generate or detect unique device addresses. In one embodiment, security-monitoring circuits detect intrusion into a player station or gaming station by monitoring security switches attached to access doors in a designated area, such as a player station cabinet. In one embodiment, access violations result in suspension of game play and can trigger additional security operations to preserve the current state of game play. These circuits also function when power is off by use of a battery backup. In one embodiment, as seen in FIG. 3A, the player station includes a sound generating device controlled by one or more sound cards 358 which function in conjunction with the processor. In one embodiment, the sound generating device includes at least one and preferably a plurality of speakers 360, which may be part of a distributed speaker system, or other sound generating hardware and/or software for generating sounds, such as playing music for the primary and/or secondary game or for other modes of the player station, such as an attract mode. In one embodiment, the player station provides dynamic sounds coupled with attractive multimedia images displayed on one or more of the display devices to provide an audio-visual representation or to otherwise display full-motion video with sound to attract players to the player station. During idle periods, the player station may display a sequence of audio and/or visual attraction messages to attract potential players to the player station. The videos may also be customized for or to provide any appropriate information.

In one embodiment, the gaming system may include a sensor, such as a camera in communication with the processor (and possibly controlled by the processor) that is selectively positioned to acquire an image of a player actively using the player station and/or the surrounding area of the player station. In one embodiment, the camera may be configured to selectively acquire still or moving (e.g., video) images and may be configured to acquire the images in either an analog, digital or other suitable format. The display devices may be configured to display the image acquired by the camera as well as display the visible manifestation of the game in split screen or picture-in-picture fashion. For example, the camera may acquire an image of the player and the processor may incorporate that image into the primary and/or secondary game as a game image, symbol or indicia. In another embodiment, the gaming system includes a wireless transceiver or a camcorder and the display segments are components of or are connected to televisions, satellites, DVD players, digital video recorders and Internet-enabled devices. In one embodiment, the game may be displayed on the central display and replicated on one or more the player stations. In another embodiment, the game is only displayed on the central display and the player station is only used to input decisions or commands in the game. In another embodiment, a primary or base game is displayed on the player station and/or the central display and one or more bonus games are displayed on the central display only. In one embodiment, the player stations provide other information to a player, such as the win/loss history of that certain game or the win/loss history of that player. It should be appreciated that the central display and the player stations may work together with a central controller or a plurality of servers to provide the games to the player in any suitable manner.

Figure 3B:
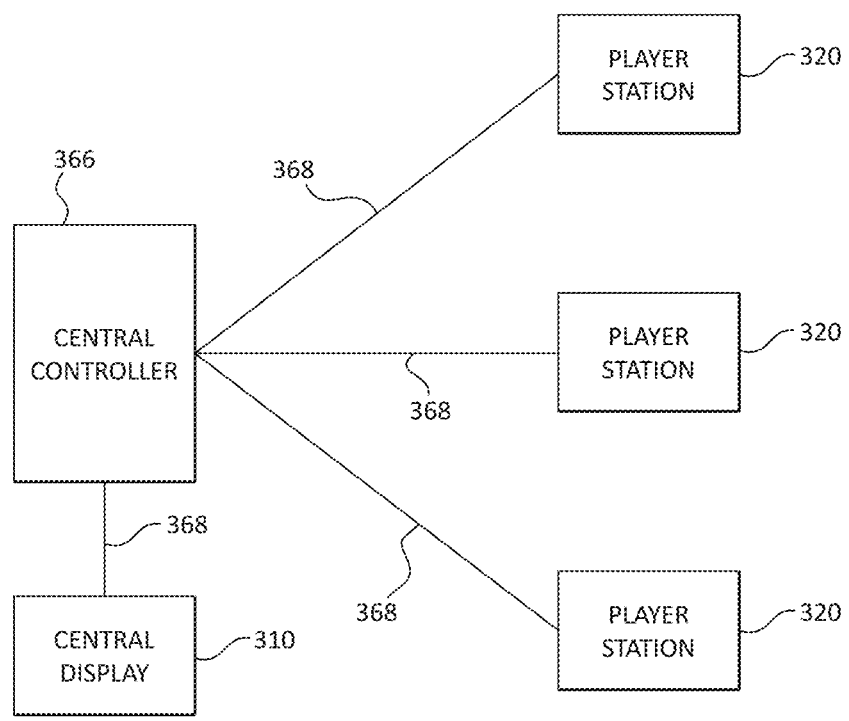
FIG. 3B is a block diagram illustrating player stations in communication with a central controller and a central display in communication with the central controller for use in the gaming device of FIG. 2, in which aspects of the present invention may be realized.

FIG. 3B is a block diagram illustrating a player station 320 in communication with a central controller and a central display 310 in communication with the central controller for use in the gaming device of FIG. 2, in which aspects of the present invention may be realized. In one embodiment, as illustrated in FIG. 3B, one or more of the player stations 320 are in communication with each other and/or at least one central server, central controller or remote host 366 through a data network or remote communication link 368. The central server, central controller or remote host is any suitable server or computing device, which includes at least one processor and at least one memory or storage device, and may also be in communication with a central display 310. In other embodiments, the central server is a progressive controller or a processor of one of the player stations in the gaming system. In these embodiments, the processor of each player station is configured to transmit and receive events, messages, commands, a current progressive value or any other suitable data or signal between the individual player station and the central server. The player station processor is operable to execute such communicated events, messages or commands in conjunction with the operation of the player station. Moreover, the processor of the central server is configured to transmit and receive events, messages, commands or any other suitable data or signal between the central server and each of the individual player stations. The central server processor is operable to execute such communicated events, messages or commands in conjunction with the operation of the central server. It should be appreciated that one or more of each of the functions of the central controller may be performed by one or more player station processors. It should be further appreciated that one, more or each of the functions of one or more player station processors as disclosed herein may be performed by the central controller. In one embodiment, the central controller has an Uninterruptible Power Supply ("UPS"). In one embodiment, the UPS is a rack mounted UPS module.

In one embodiment, the game outcome provided to the player is determined by a central server or controller and provided to the player at the player station. In this embodiment, each of the player stations is in communication with the central server or controller. Upon a player initiating game play at one of the player stations, the initiated player station communicates a game outcome request to the central server or controller. In one embodiment, the central server or controller receives the game outcome request and randomly generates a game outcome for the primary game based on probability data. In another embodiment, the central server or controller randomly generates a game outcome for the secondary game based on probability data. In another embodiment, the central server or controller randomly generates a game outcome for both the primary game and the secondary game based on probability data. The central server or controller is capable of storing and utilizing program code or other data similar to the processor and memory device of the player station. In an alternative embodiment, the central server or controller maintains one or more predetermined pools or sets of predetermined game outcomes. The central server or controller receives the game outcome request and independently selects a predetermined game outcome from a set or pool of game outcomes. The central server or controller flags or marks the selected game outcome as used. Once a game outcome is flagged as used, it is prevented from further selection from the set or pool and cannot be selected by the central controller or server upon another wager. The provided game outcome can include a primary game outcome, a secondary game outcome, primary and secondary game outcomes, or a series of game outcomes. The central server or controller communicates the generated or selected game outcome to the initiated player station. The player station receives the generated or selected game outcome and provides the game outcome to the player. In an alternative embodiment, how the generated or selected game outcome is to be presented or displayed to the player, such as a reel symbol combination of a player station or a hand of cards dealt in a card game, is also determined by the central server or controller and communicated to the initiated player station to be presented or displayed to the player. Central production or control can assist a gaming establishment or other entity in maintaining appropriate records, controlling gaming, reducing and preventing cheating or electronic or other errors, reducing or eliminating win-loss volatility.

In one embodiment, the player stations disclosed herein are associated with or otherwise integrated with one or more player tracking systems. In this embodiment, the player station and/or player tracking system tracks players gaming activity at the player station. In one such embodiment, the player station and/or associated player tracking system timely tracks when a player inserts their playing tracking card to begin a gaming session and also timely tracks when a player removes their player tracking card when concluding play for that gaming session. In another embodiment, rather than requiring a player to insert a player-tracking card, the player station utilizes one or more portable devices carried by a player, such as a cell phone, a radio frequency identification tag or any other suitable wireless device to track when a player begins and ends a gaming session. In another embodiment, the player station utilizes any suitable biometric technology or ticket technology to track when a player begins and ends a gaming session. During one or more gaming sessions, the player station and/or player tracking system tracks any suitable information, such as any amounts wagered, average wager amounts and/or the time these wagers are placed. In different embodiments, for one or more players, the player tracking system includes the player's account number, the player's card number, the player's first name, the player's surname, the player's preferred name, the player's player tracking ranking, any promotion status associated with the player's player tracking card, the player's address, the player's birthday, the player's anniversary, the player's recent gaming sessions, or any other suitable data. The player stations are capable of being connected together through a data network. In one embodiment, the data network is a local area network (LAN), in which one or more of the player stations are substantially proximate to each other and an on-site central server or controller as in, for example, a gaming establishment or a portion of a gaming establishment. In another embodiment, the data network is a wide area network (WAN) in which one or more of the player stations are in communication with at least one off-site central server or controller. The player stations may be located in a different part of the gaming establishment or within a different gaming establishment than the off-site central server or controller. Thus, the WAN may include an off-site central server or controller and an off-site player station located within gaming establishments in the same geographic area, such as a city or state. The WAN gaming system may be substantially identical to the LAN gaming system described above, although the number of player stations in each system may vary relative to each other.

In one embodiment, as a benefit to one or more of the gaming venues (e.g., a casino), using the player tracking system, along with use of the GPS positioning, for identifying the movements of the players throughout the gaming venues, identifying cash, money, credits, and award amounts spent along with various trends (e.g., historical) for generating visual graphs while displaying showing top view of the gaming venue (e.g., looking down from above the gaming venue) to improve casino layouts and identify patterns and movements of all types of players.

In another embodiment, the data network is an Internet or intranet. The operation of the player station can be viewed at the player station with at least one Internet browser. Operation of the player station and accumulation of credits may be accomplished with only a connection to the central server or controller (the Internet/intranet server) through a conventional phone or other data transmission line, digital subscriber line (DSL), T-I line, coaxial cable, fiber optic cable, WIFI, or other suitable connection. Players may access an Internet game page from any location where an Internet connection and computer, or other Internet facilitator is available. The expansion in the number of computers and number and speed of Internet connections in recent years increases opportunities for players to play from an ever-increasing number of remote sites. It should be appreciated that enhanced bandwidth of digital wireless communications may render such technology suitable for some or all communications, particularly if such communications are encrypted. Higher data transmission speeds may be useful for enhancing the sophistication and response of the display and interaction with the player.

In another embodiment, as described above, the gaming system is in communication with a central server or controller. The central server or controller may be any suitable server or computing device, which includes at least one processor and a memory or storage device. In alternative embodiments, the central server is a progressive controller or another player station in the gaming system. In one embodiment, the memory device stores different game programs and instructions, executable by a player station processor, to control the player station. Each executable game program represents a different game or type of game, which may be played on one or more of the player stations in the gaming system. Such different games may include the same or substantially the same game play with different pay tables. In different embodiments, the executable game program is for a primary game, a secondary game or both. In another embodiment, the game program may be executable as a secondary game to be played simultaneous with the play of a primary game (which may be downloaded to or fixed on the player station) or vice versa.

In this embodiment, one, all or a plurality of the player stations at least includes one or more display devices and/or one or more input devices for interaction with a player. A local processor, such as the above-described player station processor or a processor of a local server, is operable with the display device(s) and/or the input device(s) of one or more of the player stations. In operation, the central controller is operable to communicate one or more of the stored game programs to at least one local processor. In different embodiments, the stored game programs are communicated or delivered by embedding the communicated game program in a device or a component (e.g., a "chip" to be inserted in a player station), writing the game program on a disc or other media, downloading or streaming the game program over a dedicated data network, internet or a telephone line. After the stored game programs are communicated from the central server, the local processor executes the communicated program to facilitate play of the communicated program by a player through the display device(s) and/or input device(s) of the player station. That is, when a game program is communicated to a local processor, the local processor changes the game or type of game played at the player station or displayed on the display segment. Though the illustrated embodiments are described with the central controller determining a game result for the player and communicating that result to the central display 310 and one or more player stations, any other suitable game determining method may be employed in any embodiment of the present disclosure. In one embodiment, the central display 310 is associated with a central display 310 server. This central display 310 server determines the game outcome for the games played on each of the display segments. The central display 310 server communicates the game outcome to the central controller, which communicates the game outcome to one or more of the player stations.

In one embodiment, the central controller determines the award to provide to the player based on the game outcome. In another embodiment, the player stations determine the award and/or progress jackpot/value to provide to the players based on the game outcomes. In another embodiment, the central controller determines the game outcome displayed on the central display 310 and the player station determines any award and/or progress jackpot/value to provide to the player based on the game outcome. The player station determines both the game outcome and any award to provide to the player based on the game out come. In another embodiment, the central controller determines part of the outcome and the player station determines part of the outcome. That is, both the central controller and the player station determine part of a player's outcome and/or award.

Further, in the gaming industry, many different manufacturers make gaming machines and player stations. The communication protocols on the player station may be hard-wired into the player station and each player station/gaming machine manufacturer may utilize a different proprietary communication protocol. A player station manufacturer may also produce host systems, in which case their player stations are compatible with their own host systems. However, in a heterogeneous gaming environment, player stations from different manufacturers, each with its own communication protocol, may be connected to host systems from other manufacturers, each with another communication protocol. Therefore, communication compatibility issues regarding the protocols used by the player stations in the system and protocols used by the host systems must be considered.

In another embodiment, player stations at one or more gaming sites may be networked to a central server in a progressive configuration, wherein a portion of each wager to initiate a base or primary game may be allocated to bonus or secondary event awards. In one embodiment, a host site computer is coupled to central servers at a variety of mutually remote gaming sites for providing a multi-site linked progressive automated gaming system. The host site computer may serve player stations distributed throughout a number of properties at different geographical locations including, for example, different locations within a city or different cities within a state. The host site computer may be maintained for the overall operation and control of the system. A host site computer may oversee the entire progressive gaming system and may be the master for computing all progressive jackpots and values for each and every gaming device. All participating gaming sites report to, and receive information from, the host site computer. Each central server computer may be responsible for all data communication between the player station hardware and software and the host site computer. An individual player station may trigger a progressive win, for example through a game play event such as a symbol-driven trigger in the multi-component game. The central server or other central controller determines when a progressive win is triggered. The central controller and an individual player station may work in conjunction with each other to determine when a progressive win is triggered, for example through an individual player station meeting a predetermined requirement established by the central controller. The progressive award win may be triggered based on one or more game play events, such as a symbol-driven trigger. In other embodiments, the progressive award triggering event or qualifying condition may be by exceeding a certain amount of game play (such as number of games, number of credits, or amount of time), or reaching a specified number of points earned during game play. In another embodiment, a player station is randomly or apparently randomly selected to provide a player of that player station one or more progressive awards. In one such embodiment, the player station does not provide any apparent reasons to the player for winning a progressive award, wherein winning the progressive award is not triggered by an event in or based specifically on any of the plays of any primary game. That is, a player is provided a progressive award without any explanation or alternatively with simple explanations. In another embodiment, a player is provided a progressive award at least partially based on a game triggered or symbol triggered event, such as at least partially based on the play of a primary game. In one embodiment, one or more of the progressive awards are each funded via a side bet or side wager. In this embodiment, a player must place or wager a side bet to be eligible to win the progressive award associated with the side bet. In one embodiment, the player must place the maximum bet and the side bet to be eligible to win one of the progressive awards. In another embodiment, if the player places or wagers the required side bet, the player may wager at any credit amount during the primary game (i.e., the player need not place the maximum bet and the side bet to be eligible to win one of the progressive awards).

In one such embodiment, the greater the player's wager (in addition to the placed side bet), the greater the odds or probability that the player will win one of the progressive awards. It should be appreciated that one or more of the progressive awards may each be funded, at least in part, based on the wagers placed on the primary games of the gaming machines in the gaming system, via a gaming establishment or via any suitable manner. In another embodiment, one or more of the progressive awards are partially funded via a side-bet or side-wager, which the player may make (and which may be tracked via a side-bet meter). In one embodiment, one or more of the progressive awards are funded with only side-bets or side-wagers placed. In another embodiment, one or more of the progressive awards are funded based on players' wagers as described above as well as any side-bets or side-wagers placed. In one alternative embodiment, a minimum wager level is required for a player station to qualify to be selected to obtain one of the progressive awards. In one embodiment, this minimum wager level is the maximum wager level for the primary game in the gaming machine. In another embodiment, no minimum wager level is required for a gaming machine to qualify to be selected to obtain one of the progressive awards.

In another embodiment, players at a linked player station in a gaming system participate in a group gaming environment. In one embodiment, players at linked player stations work in conjunction with one another, such as playing together as a team or group, to win one or more awards. In one such embodiment, any award won by the group is shared, either equally or based on any suitable criteria, amongst the different players of the group. In another embodiment, players linked player stations compete against one another for one or more awards. In one such embodiment, players at linked player stations participate in a gaming tournament for one or more awards. In another embodiment, players at linked player stations play for one or more awards wherein an outcome generated by one player station affects the outcomes generated by one or more linked player stations.

Figure 4:
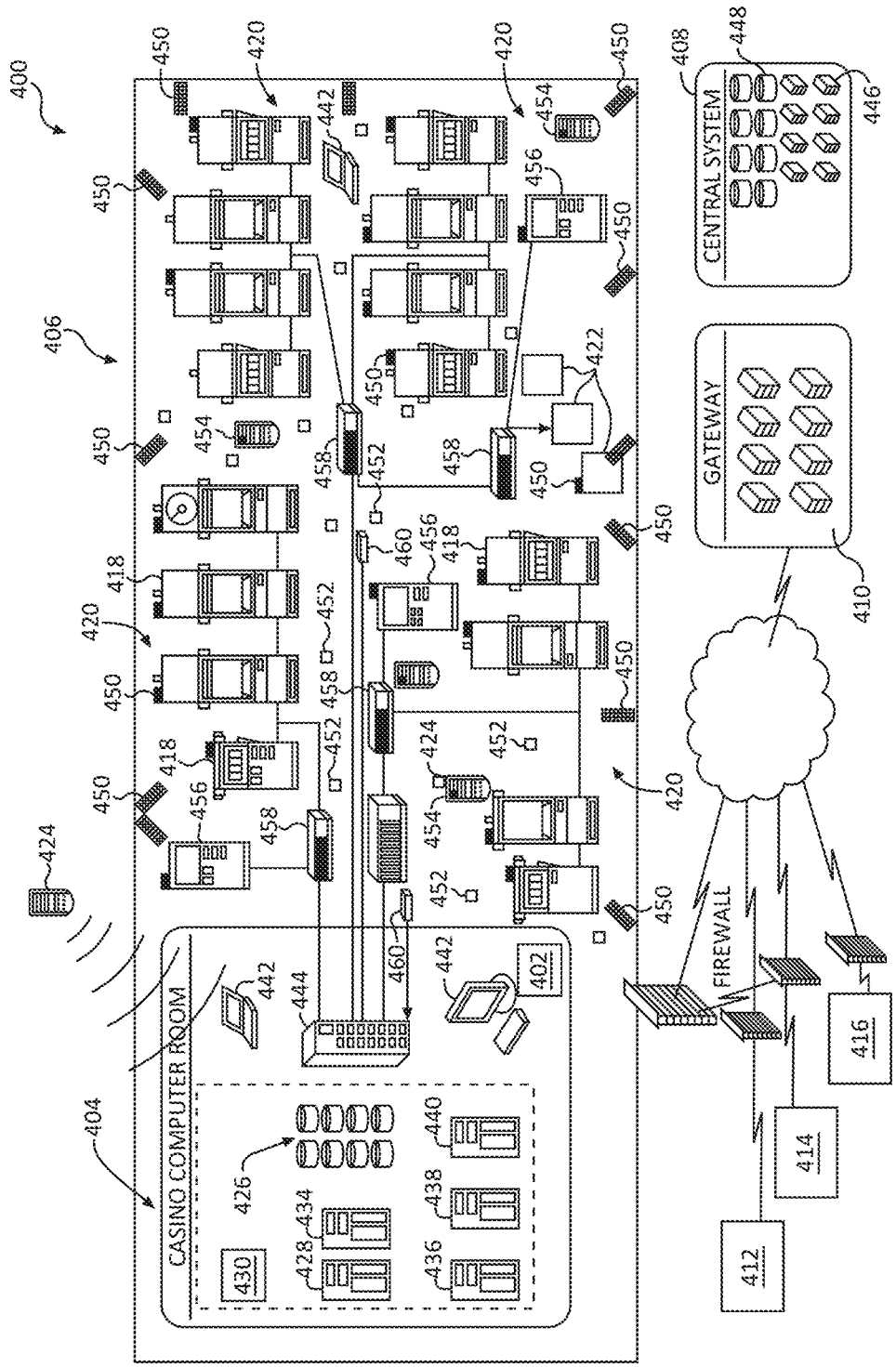
FIG. 4 is a schematic block diagram of a server-based gaming network in which aspects of the present invention may be realized.

FIG. 4 is a schematic block diagram of a server-based gaming network 400 in accordance with an exemplary embodiment of the present invention. In the exemplary embodiment, network 400 includes a slot floor mix recommendation system 402 incorporated therein. In one embodiment, slot floor mix recommendation system 402 is a stand alone system communicatively coupled to network 400. In various embodiments, slot floor mix recommendation system 402 is incorporated within various components of network 400. Network 400 provides methods and devices for managing one or more networked gaming establishments. Network 400 may be embodied in what is known as a server-based gaming network, sbX™ network. For example, in one embodiment, a host may be included in the network, such as a server-based gaming network. For example, a gaming server (e.g., an sbX™ server) may be an example of the host. The gaming server (e.g., the sbX™ server) may be a set of servers running central applications and may attach as the host to EGMs via the gaming network. In one embodiment, a host, operating in the gaming network, may be a server (e.g., an sbX™ server) managing and controlling the gaming network (e.g., an sbX™ network). In one embodiment, the host, operating in the gaming network, may monitor the monetary activity of the EGM. The host may track any error conditions on the EGM. The host may configure the EGM such as to enable/disable games, download games, and configure game parameters (denomination, payback, etc.). For example, a gaming management solution (e.g., IGT® sbX™ gaming management solution) may be a server-based system to act as a repository for all game content that may be downloaded to EGMs giving each EGM instant access to the technology within the EGM's environment. The game software, random number generator and game logic are controlled by the EGM. This significantly increases configuration speed so that games may be adapted and seamlessly integrate analytics to the database in minutes. Game titles are accessed from the server using a floor manager (e.g., IGT Floor Manager®), running on the host, and allow operators to reconfigure their gaming floor almost instantly. In one embodiment, the floor manager, operating on the host, is a G2S-compliant game-to-system management solution that enables operators to remotely change the game mix on the casino floor. In one embodiment, the floor manager application provides operators with sophisticated and user-friendly visualization tools to analyze terminal (e.g., the EGM) and game performance in real-time. Using Quick Change functionality (QCF), the floor manager, running on the host server(s), enables operators to rapidly locate low performing games, select a new theme from the game library and download the new theme on the EGM in the gaming venue floor within minutes. The software displays a map of the casino floor and highlights EGMs color-coded to indicate performance. Operators can select individual terminals and receive analysis at terminal-, multi-game and single-game level, based on KPIs such as coin-in, actual win and occupancy of game. In one embodiment, the floor manager application is a gateway to a game-to-system library allowing operators to quickly schedule changes or switch between themes. Once selected, the game's configurations can be set including denomination, max bet and even volume and credit limits on the EGM. For example, new gaming industry-leading themes may be added to the game library every month and the floor manager application provides rapid deployment to the gaming floor to ensures an EGM will maintain high performance and continually provide the user with newer and advanced games to add to the user's favorite and/or preferred games. In one embodiment, the quick recognition and eradication of low performing games and ability to respond to consumer requests on the floor, empowers a gaming venue to concentrate on player satisfaction and gaming experience.

In addition, with the sbX™ gaming management, as each EGM connected to the system is self-sufficient, if there is a malfunction or connectivity fault, information is backed up at the individual EGM for a predetermined period of time (e.g., two weeks), ensuring no data loss. Once the problem is resolved and the EGM is re-connected to a server, the backed-up data is instantly dropped into the database. Operators now have the ability to run their own choice of games on any interconnected terminal in the gaming venue. This allows management to switch between games at any time, delivering an unmatched level of flexibility and control over their gaming environment. Users are also able to select the games (e.g., a favorite and/or preferred EGM) and denominations they wish to play at the terminal. In one embodiment, the sbX™ gaming management system delivers a flexible and diversified approach to management and control of the casino floor, reconfiguring gaming machines at the appropriate time and schedule. For example, in one embodiment, all EGMs connected to the server are granted full access to themes held in a game's depository and operators can reconfigure each terminal remotely from the workstation. A Games Library may be included and may contain over 300 gaming titles in a game-to-system depository. In one embodiment, the sbX™ gaming management application allows for games to be updated in minutes and with this simple configuration process in place, operators can place better focus on in-depth player statistics. Accurate information in real-time optimizes marketing strategies, to provide the ultimate gaming experience and ensure the floor remains dynamic. Instantaneous analysis and decisions may be implemented to adjust elements and increase user satisfaction and loyalty. This also enables a gaming venue to ensure users are able to play the latest content available. Various game themes can be changed, tested and reverted in different areas of the gaming venue with rapid execution. In one embodiment, the sbX™ application and its integrated modules provide for data analysis and also focus on player experience thereby allowing for the development of innovative marketing programs. For example, in one embodiment, certain banks of machines may be adapted to a featured game, linked to a proprietary progressive jackpot and then heavily promoted during certain times. Thus, these games may become a favorite and preferred EGM during a particular time. Following the promotion, the EGMs can quickly be restored to their original games. In one embodiment, the sbX™ system may be driven by IGT's Advanced Video Platform (AVP®) with the technology seamlessly integrated with all modules, permitting fast connectivity and advanced capabilities. In addition, GSA open protocols are used so that sbX™ applications are interoperable with third-party devices that have also adopted GSA open protocols.

Thus, in one embodiment, if a demand for a particular type of the EGM is in high demand (e.g., multiple users are selecting a favorite and/or preferred game on a particular EGM) but the supply of the favorite and/or preferred game on a particular EGM is low, the floor manager application provides the ability to quickly (e.g., within minutes) update and replace the EGMs having low performing games and/or non-preferred games on the EGM with the higher performing and/or favorite and preferred game on a particular EGM.

In one embodiment, network 400 permits the convenient provisioning of networked gaming machines and other devices relevant to casino operations. Game themes may be easily and conveniently added or changed, if desired. Related software, including but not limited to player tracking software and peripheral software may be downloaded to networked gaming machines, mobile gaming devices, thin clients and/or other devices, such as kiosks, networked gaming tables, player stations.

In some implementations, servers or other devices of a central system will determine game outcomes and/or provide other wager gaming functionality. In some such implementations, wagering games may be executed primarily on one or more devices of a central system, such as a server, a host computer, etc. For example, wager gaming determinations, such as interim and final game outcomes and bonuses, may be made by one or more servers or other networked devices. Player tracking functions, accounting functions and some display-related functions associated with wagering games may be performed, at least in part, by one or more devices of a casino network and/or of a central system.

In the exemplary embodiment, network 400 includes a casino computer room 404 and networked devices of a gaming establishment 406. Gaming establishment 406 is configured for communication with a central system 408 via a gateway 410. Other gaming establishments 412, 414, and 416 are also configured for communication with central system 408.

Gaming establishment 406 includes multiple gaming machines 418. Some of gaming machines 418 form a cluster or "bank" 420 of gaming machines 418. Gaming machines 418 are configured for communication with one or more devices of casino computer room 404 or similar devices disposed elsewhere in gaming establishment 406. Some of gaming machines 418 may be configured to read from, and/or write information to, a portable instrument such as but not limited to, a ticket and a player loyalty device. In one embodiment, gaming establishment 406 also includes a bank of networked gaming tables 422. However, network 400 may be implemented in gaming establishments having any number of gaming machines, gaming tables, etc. It will be appreciated that many gaming establishments 406 include hundreds or even thousands of gaming machines 418, gaming tables 422 and/or mobile devices 424, not all of which are necessarily associated bank 420 and some of which may not be connected to network 400. At least some of gaming machines 418 and/or mobile devices 424 may be "thin clients" that are configured to operate, at least in part, according to instructions from another device (such as a server).

Multiple storage devices 426, sbX™ server 428, License Manager 430, servers 434, 436, 438, and 440, host device(s) 442, and main network device 444 are disposed within computer room 404 of gaming establishment 406. In practice, more or fewer devices may be used. Depending on the implementation, some such devices may reside elsewhere in gaming establishment 406.

One or more of the devices in computer room 404 (or similar devices disposed elsewhere in gaming establishment 406 or in gaming establishment 412, 414, or 416) may be configured to provide functionality relevant to embodiments of the present invention. For example, one or more of servers 434, 436, 438, or 440 may be configured for communication with gaming machines 418 that are configured to provide a subset of themes for selection by a player. For example, one or more such servers may be configured to provide a selection of a subset of four themes from a large number of available themes.

Accordingly, in some embodiments at least some gaming establishments may be configured for communication with one another. In this example, gaming establishments 412, 414, and 416 are configured for communication with casino computer room 404. Such a configuration may allow devices and/or operators in casino 406 to communicate with and/or control devices in other casinos. In some such implementations, a server (or another device) in computer room 404 may be configured to communicate with and/or control devices in gaming establishments 412, 414, and 416. Conversely, devices and/or operators in another gaming establishment may communicate with and/or control devices in casino 406.

Some of these servers in computer room 404 may be configured to perform tasks relating to accounting, player loyalty, bonusing/progressives, configuration of gaming machines, etc. A Radius server and/or a DHCP server may also be configured for communication with the gaming network. In various embodiments, sbX™ server 428 and the other servers shown in FIG. 4 include or are in communication with clustered CPUs, redundant storage devices, including backup storage devices, switches, etc. Such storage devices may include a redundant array of independent disks (RAID) array, back-up hard drives and/or tape drives, etc.

In various embodiments, many of these devices (including but not limited to License Manager 430, servers 434, 436, 438, and 440, and main network device 444) are mounted in a single rack with sbX™ server 428. Accordingly, many or all such devices will sometimes be referenced in the aggregate as an "sbX™ server." However, in alternative implementations, one or more of these devices is in communication with sbX™ server 428 and/or other devices of the network but located elsewhere. For example, some of the devices could be mounted in separate racks within computer room 404 or located elsewhere on the network. Moreover, in some implementations large volumes of data may be stored elsewhere, e.g., via a storage area network ("SAN").

Computer room 404 may include one or more operator consoles or other host devices that are configured for communication with other devices within and outside of computer room 404. Such host devices may be provided with software, hardware and/or firmware for implementing functions described herein. However, such host devices need not be located within computer room 404. Wired host devices 442 (which are desktop and laptop computers in this example) and wireless devices 424 (which are PDAs in this example) may be located elsewhere in gaming establishment 406 or at a remote location.

Some embodiments include devices for implementing access control, security and/or other functions relating to the communication between different devices on the network. One or more devices in central system 408 may also be configured to perform, at least in part, tasks specific to embodiments of the present invention. For example, one or more servers 446, storage devices and/or host devices 442 of central system 408 may be configured to implement the functions described in detail elsewhere herein. One or more servers 446, storage devices 448 and/or host devices 442 of central system 408 may maintain player account information.

Some gaming networks 400 provide features for gaming tables that are similar to those provided for gaming machines, including but not limited to bonusing, player loyalty/player tracking, the use of cashless instruments, etc. Some configurations can provide automated, multi-player roulette, blackjack, baccarat, and other table games. The table games may be conducted by a dealer and/or by using some form of automation, which may include an automated roulette wheel, an electronic representation of a dealer, etc. In some such implementations, devices such as cameras 450, radio frequency identification devices 452 and 454, etc., may be used to identify and/or track patrons, playing cards, chips, etc. Some of gaming tables 422 may be configured for communication with individual player terminals (not shown), which may be configured to accept bets, present an electronic representation of a dealer, indicate game outcomes, etc.

Moreover, some such automated gaming tables 422 and/or associated player terminals may include, or may be configured for communication with, a device that includes a coin-out meter, a ticket reader, a card reader, a ticket printer, and/or other related features. In some implementations, one such device may provide such functionality to a plurality of automated gaming tables 422 and/or associated player terminals.

Gaming establishment 406 also includes networked kiosks 456. Kiosks 456 may include card readers, ticket readers, printers, a user interface system, one or more displays, etc. Depending on the implementation, kiosks 456 may be used for various purposes, including but not limited to cashing out, prize redemption, redeeming points from a player loyalty program, redeeming "cashless" indicia such as bonus tickets, smart cards, etc.

Kiosks 456 may be configured to read information from, and/or write information to, a portable instrument such as a smart card, a ticket, a card having a magnetic strip, etc. The corresponding gaming devices are preferably configured for communication with such kiosks 456 and vice versa. Accordingly, some such kiosks 456 may include a wireless interface that is configured for communication with mobile gaming devices 424.

In the exemplary embodiment, each bank 420 has a corresponding switch 458. Each switch 458 is configured for communication with one or more devices in computer room 404 via main network device 444, which combines switching and routing functionality in this example. Although various communication protocols may be used, some preferred implementations use the Gaming Standards Association's G2S Message Protocol. Some systems may use a gaming-industry-specific transport layer called CASH™, which offers additional functionality and security.

Gaming establishment 406 may also include an RFID network, implemented in part by RFID switches 460 and multiple RFID readers 452. An RFID network may be used, for example, to track objects such as mobile gaming devices 424, which include RFID tags 454, patrons, chips, player loyalty devices, etc., in the vicinity of gaming establishment 406.

Various alternative network topologies can be used to implement different aspects of the invention and/or to accommodate varying numbers of networked devices. For example, some gaming establishments may include cameras 450 for implementing advanced player tracking, player navigation or other functionality. Gaming establishments with large numbers of gaming machines 418 may require multiple instances of some network devices (e.g., of main network device 444, which combines switching and routing functionality in this example) and/or the inclusion of other network devices not shown in FIG. 4. Some embodiments may include one or more middleware servers disposed between kiosks 456, RFID switches 460 and/or bank switches 458 and one or more devices (e.g., a corresponding server, router or other network device) in computer room 404. Such middleware servers can provide various useful functions, including but not limited to the filtering and/or aggregation of data received from switches, from individual gaming machines and from other devices. Some implementations of the invention include load-balancing methods and devices for otherwise managing network traffic.

In one embodiment, using the embodiments described herein, a Personal Electronic Device[(PED) and/or other type of an external application (e.g., mobile application, web application, and the like) may be used to transfer money to and from the EGM employing a service window application, and the PED may use a variety of communication protocols such as near field communication (NFC), Bluetooth or other wireless communications to transfer money to and from the EGM, particularly using the information window (e.g., a service window) of the EGM, which may be operated by and/or in communication with an sbX™ server 428, central system 408, servers 446, a main network device 444, storage devices and/or host devices 442 of central system 408 may be configured to implement the functions described in detail elsewhere herein and/or via the external application. The money of a player may come from any type of financial institution (e.g., a bank) or a player wagering account of a gaming venue. In one embodiment, the wireless communication may go directly to the processing unit on a particular and identified EGM being in communication with and/or controlled by a sbX™ server 428, central system 408, servers 446, a main network device 444, storage devices and/or host devices 442 of central system 408 may be configured to implement the functions described in detail elsewhere herein. The EGM may be configured with a hardware device (e.g., those described in FIG. 4) that communicates with the PED. The EGM, using a service window application, may contain a device that communicates with a payment acceptor (e.g., a physical media, coin, and/or bill acceptor) or printer to simulate bills and tickets. The EGM may have a device (software and/or hardware) that communicates with a back end host that ultimately uses SAS or G2S to move the money to and from the particular and identified EGM. This configuration allows all of EGMs to be retrofitted for mobile payments.

In one embodiment, when an actual wireless mobile payment transfer can occur via a mobile device, money can be electronically moved virtually, along with the associated unique mobile device identifier tied to a player's account and/or gaming event on the EGM, from an identified and/or a preferred EGM employing the service window application to the PED or vice versa. The service window application of the EGM can request the mobile device identifier from either the mobile device itself or request the mobile device identifier from the sbX™ server 428, the central system 408, servers 446, the main network device 444, storage devices and/or host devices 442 of central system 408 to implement the present invention described herein in order to prevent mobile payment transfers between mobile devices that do not have the associated unique mobile device identifier originally and an EGM, sbX™ server 428, the central system 408, servers 446, the main network device 444, storage devices and/or host devices 442 of central system 408.

In one embodiment, the EGM can employ the service window application in communication with the sbX™ server 428, the central system 408, servers 446, the main network device 444, storage devices and/or host devices 442 of central system 408 to bind mobile transfers of mobile payments in a gaming system. The service window of the EGM can receive, from the mobile device, a cash out request to receive winnings resulting from one or more game wins of an event, wherein the event is a gaming event resulting from the placement of the one or more wagers at the EGM. The EGM can request, via a service window application of the EGM, from the mobile device and/or sbX™ server 428, the central system 408, servers 446, the main network device 444, storage devices and/or host devices 442 of central system 408 in the gaming system, a mobile device identification (ID) assigned to the mobile device and associated with the player account ID of a player's account. The player's account ID is associated with the event and the host device stores each mobile device ID assigned for each of a plurality of mobile devices. The service window application of the EGM can receive the mobile device ID from both the mobile device and/or the sbX™ server 428, the central system 408, servers 446, the main network device 444, storage devices and/or host devices 442 of central system 408. The service window application EGM can verify the mobile device ID received from the mobile device and/or the sbX™ server 428, the central system 408, servers 446, the main network device 444, storage devices and/or host devices 442 of central system 408 are identical and associated with the player's account ID currently logged into the EGM in order to approve and transfer the winnings resulting from one or more game wins of the event to the mobile device. The service window of the EGM can electronically transfer, to the mobile device, a mobile payment of the winnings resulting from the one or more game wins of the gaming session and/or gaming event after verifying the mobile device ID using the sbX™ server 428, the central system 408, servers 446, the main network device 444, storage devices and/or host devices 442 of central system 408, which can be in communication with the mobile device.

Figure 5:
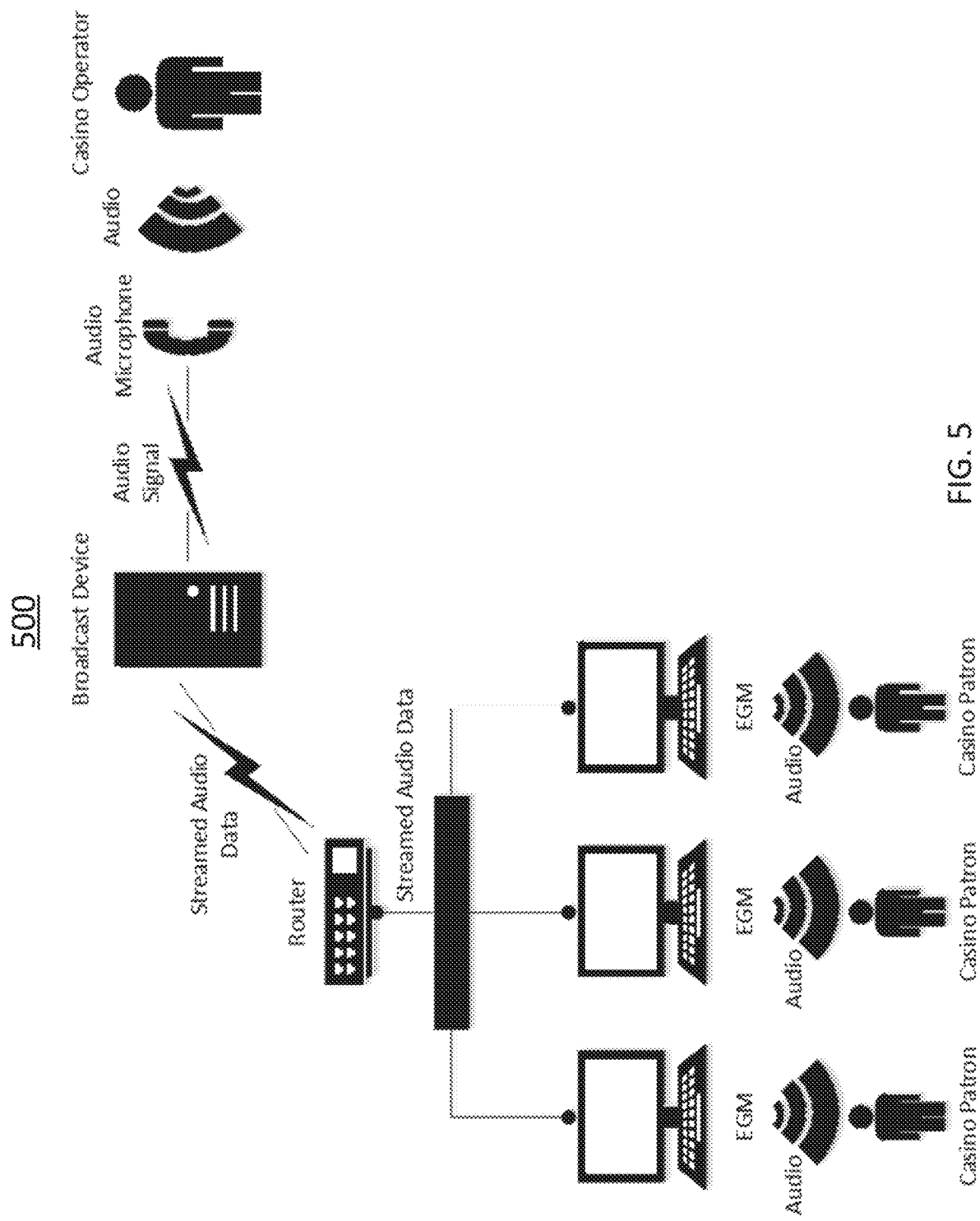
FIG. 5 is block diagram illustrating an exemplary method for ad hoc and push-to-talk distributed real-time communication for an electronic gaming machine (EGM) in which aspects of the present invention may be realized.

Having described one or more gaming venue and/or EGM's architectures, functionality, and/or systems and methods of operations, turning now to FIG. 5, a block diagram illustrating an exemplary gaming system 500 for ad hoc and push-to-talk distributed real-time communication for one or more electronic gaming machine (EGMs) is depicted. As depicted in FIG. 5, the system 500 provides targeted messages directed to one or more patrons within the gaming system using point-to-point streamed audio to broadcast the targeted messages via a disturbed speakers system installed on the one to a Nth number of EGM networked with the gaming system 500, where "N" is a positive integer. That is, the gaming system 500 can include one to an Nth number of EGM equipped with one or more speakers (included in the distributed speaker system in the gaming system 500), a network connection capable of transmitting streamed audio information between each of the EGMs, and a broadcast device, such as, for example, a gaming server, a tuner, a computing device, a smart phone, a voice activated hub, and/or other computing device. In one aspect, the network connection can be an Ethernet connection, a wireless communication network, and/or other communication network. In one aspect, the gaming system 500 depicts a user (e.g., a gaming system operator "casino operator") can initiate a voice command (an "audio signal") via an audio microphone (and/or a voice activated hub) to communicate the audio signal to the broadcast device. For example, the user may provide an audio signal (e.g., voice data) into the audio microphone stating, "Attention, the gaming tournament will begin in one hour. Please see a casino attendant for entering the gaming tournament." The audio microphone, such as a mobile device or microphone, can be configured to transmit the audio signal to the broadcast device. The broadcast device receives the audio signal and processes the audio signal. The broadcast device can transmit (which may be through a router in the gaming system 500) the process audio signal as an audio data stream, which may include at least one audio file, to the one or more EGMs to be broadcasted in through the one or more speakers equipped in the one or more EGMs in real time to one or more gaming patrons ("casino patrons). In one aspect, real time can be defined as an actual time during which a process or an event occurs. In an additional aspect, real time can also be defined as processing, generating a response, and/or for performing an operation, event, action item, or task within a specified time constraint, such as, for example, in an order of milliseconds and/or microseconds.

In one aspect, the user may configure each one of the EGMs in the gaming system 500 to selectively adjust a volume level of "in-game sounds" while broadcasting and/or playing the real-time audio. For example, in one aspect, each one of the EGMs can be enabled to incrementally reduce the volume level from one selected decibel level to an alternative selected decibel level. In an additional aspect, each one of the EGMs can be enabled to incrementally reduce the volume level to a "mute" status and/or immediately mute the volume of the one or more sounds associated with each individual EGM. In this way, the gaming system provides an ad-hoc distributed real-time announcement system to each one of the EGMs equipped with a distributed speaker system directly integrated with each gaming experience. In this way, the present technology provides increased efficiency over public announcement systems, which may not be in direct communication with each one of the EGMs and/or the distributed speaker system integrated in each EGM. Furthermore, the gaming system 500 allows for customized messages to be scaled to a selected portion of a gaming system environment, such as, for example, scaled from a selected portion of the casino to an individual patron engaging one or more wage games on an individual EGM.

For example, each gaming device can provide dynamic sounds coupled with attractive multimedia images displayed on display device to provide an audio-visual representation or to otherwise display full-motion video with sound to attract players to gaming device. Each EGM can be enabled to incrementally reduce the volume level of the dynamic sounds from one selected decibel level to an alternative selected decibel level. In an additional aspect, each one of the EGMs can be enabled to incrementally reduce the volume level of the dynamic sounds to a "mute" status and/or immediately mute the volume of the one or more sounds associated with each individual EGM. Furthermore, even during idle periods (e.g., during non-wage game operations funded by a wager received via a payment acceptor), the gaming device 210 can incrementally reduce the volume level of the dynamic sounds and/or "mute" the dynamic sounds from a sequence of audio and/or visual attraction messages to attract potential players to gaming device in order to broadcast one or more customized messages via one or more speakers of the EGM.

In this way, the various embodiments described herein provide a solution to the technical challenge of preventing unauthorized users from fraudulently transferring money or gaming credits from an authorized user's mobile device mobile payments associated with an EGM in a gaming system. By only transferring the winnings, game credit, and/or remaining monetary value from the EGM, using one or more processor devices and/or memory controllers of the EGM having logic stored thereon for executing the cash out transfer, back to the original mobile device as determined by the unique identifier increases and gains player confidence in executing mobile money transfers with an EGM in a gaming system, such as performing a cash in operation by transferring money to the EGM and receiving the electronic mobile money transferring using the one or more processor devices and/or memory controllers of the EGM having logic stored therein and in communication with the slot account system (SAS) or game-to-system (G2S).

Figure 6:
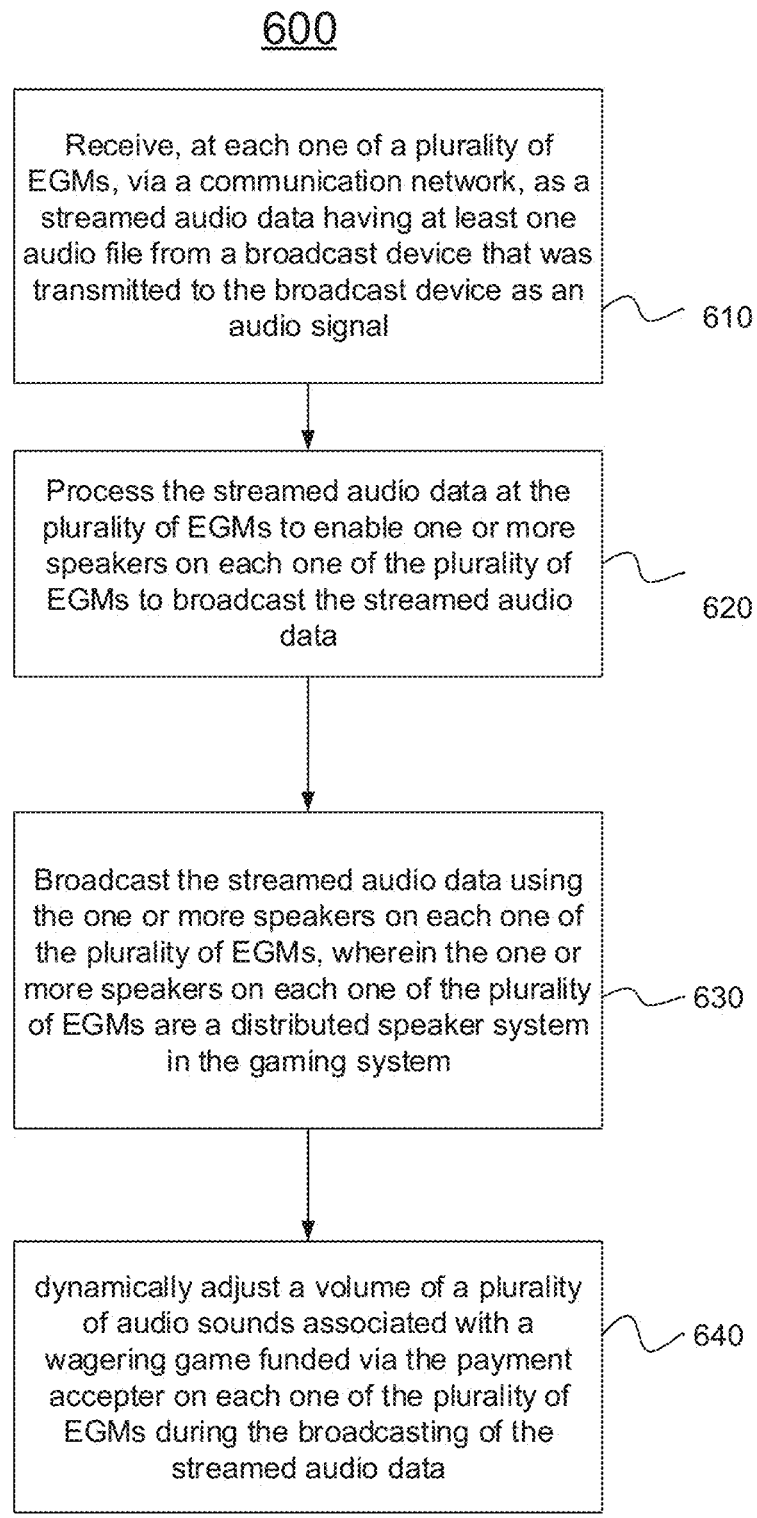
FIG. 6 is a flow chart illustrating an exemplary method for ad hoc and push-to-talk distributed real-time communication using an electronic gaming machine (EGM) in which aspects of the present invention may be realized.

FIG. 6 is a flow chart illustrating an exemplary method 600 for binding mobile transfers of mobile payments by an electronic gaming machine (EGM) utilizing assistance with a host device. In one aspect, as a preliminary operation, a mobile device can contact and/or login to a host network or host device in gaming system. For example, the mobile device can login to a player's loyalty account managed by the host device in the gaming system. In one aspect, the mobile device can login to a player's loyalty account via a service window application that is managed by the host device in the gaming system. The host network or host device can assign a randomly chosen value, as the unique mobile device Identifier (ID), to the mobile device and player's loyalty account prior to the player commencing a gaming session, game play or the event. In one aspect, the EGM repeats the same operation and receives the unique mobile device Identifier, that can also be associated with a player's account ID of a player's loyalty account, assigned by the host network or host device.

In one aspect, a mobile device can provide an initial mobile payment transfer along with a unique mobile device Identifier (ID) to the EGM in order to establish a credit balance for a placement of one or more wagers and to receive potential winnings resulting from one or more game wins of the event. The event can be a gaming event resulting from the placement of the one or more wagers. However, if a user does not provide the initial mobile payment transfer along with a unique mobile device Identifier (ID) to the EGM in order to establish a credit balance, but rather uses a payment acceptor for receiving a physical media having a monetary value, a physical bill, coins, and/or ticket to establish a credit balance for a placement of one or more wagers and to receive potential winnings resulting from one or more game wins of the event, a service window application of EGM can verify the user according to a player's account. That is, the service window can associate the credit balance for a placement of one or more wagers with a player's loyalty account.

Once the EGM has received a credit balance to establish a gaming session for the user, the EGM can validate that a unique mobile device identifier, which can be received from the mobile device and/or from a host device in communication with the EGM, associated with a mobile device by determining the unique mobile device identifier is associated with and matches the player's loyalty account associated with the user and gaming session. That is, the EGM can ensure that user's player loyalty account on the mobile device matches the player's loyalty account and unique mobile device identifier and player's account ID currently logged in and associated with the gaming session on the EGM.

In one aspect, 1) the user can initiate and/or send to the EGM a "cash out request" for receiving the winnings resulting from one or more game wins of the event. The cash out request can be a request for receiving from the EGM one or more mobile payment transfers of the winnings and/or gaming credits resulting from one or more game wins of the event. 2) The EGM can query a mobile device associated with the user requesting the cash out. 3) The EGM can receive from the mobile device the requested unique mobile device identifier. 4). The EGM can also query a host network or host device associated with the EGM in conjunction with and/or subsequent to querying the mobile device associated with the user requesting the cash out. 5) The EGM receives from the host network and/or the host device the requested unique mobile device identifier. 6) The EGM compares validates that the unique mobile device identifier requested and received from the host network and/or the host device matches the unique mobile device identifier requested and received from the mobile device. 7) If the unique mobile device identifier requested and received from the host network and/or the host device matches the unique mobile device identifier requested and received from the mobile device, the EGM can perform the cash out operation and provide to the mobile device a mobile payment transfer of the winnings, game credit, and/or remaining monetary value back to the original mobile device as determined with a validated unique mobile device identifier. It should be noted that if the unique mobile device identifier requested and received from the host network and/or the host device does not match the unique mobile device identifier requested and received from the mobile device requesting the cash out operation, the EGM does not perform or execute the cash out operation. In one aspect, the EGM can alert the mobile device associated with the unique mobile device identifier provided by the host and/or the mobile device having the unique mobile device identifier associated with the current gaming session related to player account ID of a player's loyalty of the cash out requested and received from the mobile device that does not match the does not match the unique mobile device identifier requested and received from the host network and/or the host device.

In one aspect, when a player's loyalty account application is installed on the mobile device the use can login into the player account for the first time using the mobile device. The mobile device contacts a host network, host application, and/or host network associated with an EGM and/or gaming system. The mobile device can provide to the EGM, the host network, host application, and/or host network and provides one or more security credentials, parameters, and/or unique mobile device identifier. In one aspect, the mobile device may only provide to the EGM, the host network, host application, and/or host network one or more security credentials. The EGM, the host network, host application, and/or host network can provide the mobile device with a unique mobile device identifier.

The EGM, the host network, host application, and/or host network can store and remember which unique mobile device identifier values that are provided to one or more mobile devices associated with one or more player loyalty accounts. The EGM can contact the host and determine which unique mobile device identifier value is associated with the player's loyalty account and player's mobile device. In one aspect, when the mobile device or the EGM performs an electronic transfer of a mobile payment, the mobile device and/or EGM can query the host application, and/or host network for the unique mobile device identifier value and then query the other device (e.g., the mobile device and/or EGM depending on which device is performing the electronic transfer) for that same unique mobile device identifier value. The transfer only happens if the mobile device and EGM have the same unique mobile device identifier value and therefore are associated with the same player account. If the unique mobile device identifier credentials are valid the host application, and/or host network can provide the unique mobile device identifier value to the mobile device application. The mobile device application can remember the unique mobile device identifier value for future reference, which may include the entire lifetime of the mobile device application on the mobile device.

FIG. 6 a flow chart illustrating an additional exemplary method for ad hoc and push-to-talk distributed real-time communication using an electronic gaming machine (EGM) in which aspects of the present invention may be realized. The method 600 can be implemented as a method or the functionality can be executed as instructions on a machine, where the instructions are included one or more computer readable mediums or one or more non-transitory machine readable storage mediums. Starting in block 610, an EGM can comprise one or more processors and memory configured to: receive, via a communication network, a streamed audio data having at least one audio file from a broadcast device that was transmitted to the broadcast device as an audio signal. The EGM can comprise one or more processors and memory configured to: process and decode the streamed audio data at the EGM to enable one or more speakers on the EGM to broadcast the streamed audio data, as in block 620. The EGM can comprise one or more processors and memory configured to: broadcast the streamed audio data using the one or more speakers on the EGM, as in block 630. The one or more speakers on the EGM are part of a distributed speaker system associated with the broadcast device in the gaming system. The EGM can comprise one or more processors and memory configured to: dynamically adjust a volume of a plurality of audio sounds associated with a wagering game funded via the payment accepter on the EGM during the broadcasting of the streamed audio data, as in block 640.

Figure 7:
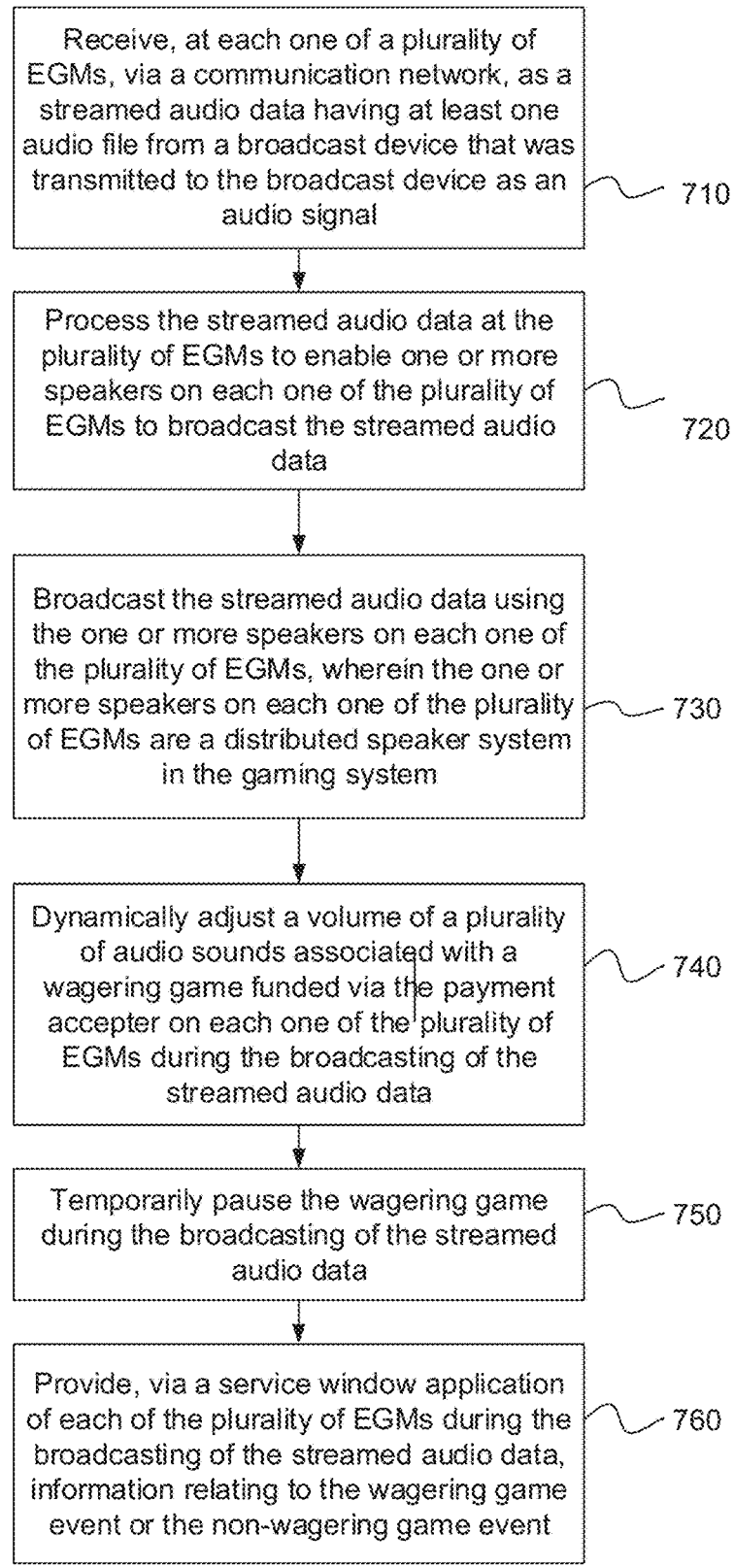
FIG. 7 is a flow chart illustrating an additional exemplary method for ad hoc and push-to-talk distributed real-time communication using an electronic gaming machine (EGM) in which aspects of the present invention may be realized.

FIG. 7 is a flow chart illustrating an additional exemplary method for ad hoc and push-to-talk distributed real-time communication using an electronic gaming machine (EGM). The functionality 700 can be implemented as a method or the functionality can be executed as instructions on a machine, where the instructions are included one or more computer readable mediums or one or more non-transitory machine readable storage mediums. The EGM can comprise one or more processors and memory configured to: receive, at the EGM via a communication network, a streamed audio data having at least one audio file from a broadcast device that was transmitted to the broadcast device as an audio signal, as in block 710. The EGM can comprise one or more processors and memory configured to: process the streamed audio data at the plurality of EGMs to enable one or more speakers on each one of the plurality of EGMs to broadcast the streamed audio data, as in block 720. The EGM can comprise one or more processors and memory configured to: broadcast the streamed audio data using the one or more speakers on the EGM, as in block 730. The one or more speakers on the EGM may be part of and/or associated with a distributed speaker system in the gaming system. The EGM can comprise one or more processors and memory configured to: dynamically adjust a volume of a plurality of audio sounds associated with a wagering game funded via the payment accepter on each one of the plurality of EGMs during the broadcasting of the streamed audio data, as in block 740. The EGM can comprise one or more processors and memory configured to: temporarily pause the wagering game during the broadcasting of the streamed audio data, as in block 750. The EGM can comprise one or more processors and memory configured to: provide, via a service window application of each of the plurality of EGMs during the broadcasting of the streamed audio data, information relating to the wagering game event or the non-wagering game event, as in block 760.

In one aspect, in conjunction with and/or as part of at least one block of FIGS. 5-7, the operations of 500, 600, and/or 700 may include each of the following. In one aspect, the EGM can mute the volume of the plurality of audio sounds associated with the wagering game during the broadcasting of the streamed audio data. The EGM can dynamically reduce the volume level of the plurality of audio sounds associated with the wagering game to a decibel level less than a volume level of the streamed audio data being broadcast. The EGM can dynamically restore the volume level of the plurality of audio sounds associated with the wagering game upon completion of broadcasting of the streamed audio data. In one aspect, the communication network can include at least one of a wireless communication network, Bluetooth, and an Ethernet connection. In one aspect, the broadcast device can be at least one of a server, a tuner, a smart phone, and an audio microphone. In an additional aspect, the streamed audio data can be a customized message from at least one of a gaming system administrator, gaming system operator, and a gaming system event coordinator.

In one aspect, the EGM can comprise one or more processors and memory configured to pause the wagering game during the broadcasting of the streamed audio data. In one aspect, the EGM can comprise one or more processors and memory configured to broadcast the streamed audio data relating to a wagering game event or non-wagering game event using the one or more speakers on each one of the plurality of EGMs; and/or provide, via a service window application of each of the plurality of EGMs during the broadcasting of the streamed audio data, information relating to the wagering game event or the non-wagering game event.

In one aspect, the PED or "mobile device" may be a biometric sensor, smart phone, an electronic tablet, a computer, a cellular phone, a portable phone, a media player, a personal data organizer, a handheld game platform, a tablet computer, a notebook computer, or any combination of such devices.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowcharts and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowcharts and/or block diagram block or blocks.

The flowcharts and block diagrams in the above figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A method of ad hoc distributed real-time communication for a plurality of electronic gaming machines (EGMs), each comprising a payment acceptor, in a gaming system, the method comprising:
under control of at least one processor and a memory comprising executable instructions that:
receive, at each one of the plurality of EGMs, via a communication network, as a streamed audio data comprising at least one audio file from a broadcast device that was transmitted to the broadcast device as an audio signal wherein the streamed audio data is initiated using a voice command performed by a remotely located user to the plurality of EGMs and comprises voice data audibly captured as spoken by the user in real-time;
process the streamed audio data at the plurality of EGMs;
broadcast the streamed audio data using a speaker on each one of the plurality of EGMs; and
dynamically adjust a volume of a plurality of audio sounds produced for a wagering game during the broadcast of the streamed audio data, wherein, during the broadcast of the streamed audio data, the volume of the plurality of audio sounds produced for the wagering game is incrementally reduced through the speaker on each of the plurality of EGMs while the volume of the streamed audio data through the speaker on each of the plurality of the EGMs during the broadcast of the streamed audio data is commensurately incrementally increased when a patron is engaging the wagering game and wherein the volume of the plurality of audio sounds produced for the wagering game is muted during an idle period in which the plurality of audio sounds produced for the wagering game are being used to provide audio attraction messages to attract potential players.

2. The method of claim 1, wherein the executable instructions immediately mute, during the idle period, the volume of the plurality of audio sounds produced for the wagering game during the broadcast of the streamed audio data.

3. The method of claim 1, wherein adjusting the volume further comprises dynamically reducing a first volume level of the plurality of audio sounds produced for the wagering game to a second volume level being less than a third volume level of the broadcast of the streamed audio data.

4. The method of claim 3, wherein the executable instructions further dynamically restore the first volume level of the plurality of audio sounds produced for the wagering game upon completion of the broadcast of the streamed audio data.

5. The method of claim 1, wherein the communication network comprises at least one of a wireless communication network, Bluetooth, and an Ethernet connection.

6. The method of claim 1, wherein the executable instructions temporarily pause the wagering game during the broadcast of the streamed audio data.

7. The method of claim 1, wherein the broadcast device is at least one of a server, a tuner, a smart phone, and an audio microphone.

8. The method of claim 1, wherein the executable instructions further:
provide, via a service window application of each of the plurality of EGMs during the broadcast of the streamed audio data, information relating to the wagering game event.

9. The method of claim 1, wherein the streamed audio data is a customized message from at least one of a gaming system administrator, a gaming system operator, and a gaming system event coordinator.

10. An apparatus of an electronic gaming machine (EGM) comprising a payment acceptor for funding a bet and providing ad hoc distributed real-time communication in a gaming system, the apparatus comprising a processor and a memory that:
receive, at the EGM via a communication network, a streamed audio data comprising at least one audio file from a broadcast device that was transmitted to the broadcast device as an audio data for real-time communication wherein the streamed audio data is initiated using a voice command performed by a remotely located user to a plurality of EGMs and comprises voice data audibly captured as spoken by the user in real-time;
process the streamed audio data at the EGM;
broadcast the streamed audio data using a speaker on the EGM; and
dynamically adjust a volume of a plurality of audio sounds produced for a wagering game during the broadcast of the streamed audio data such that the volume of the plurality of audio sounds produced for the wagering game is incrementally reduced through the speaker while commensurately incrementally increasing the volume of the streamed audio data through the speaker during the broadcast of the streamed audio data when a patron is engaging the wagering game whereas the volume of the plurality of audio sounds produced for the wagering game is muted during an idle period in which the plurality of audio sounds produced for the wagering game are being used to provide audio attraction messages to attract potential players to play the EGM.

11. The apparatus of claim 10, wherein the processor and the memory immediately mute, during the idle period, the volume of the plurality of audio sounds produced for the wagering game during the broadcast of the streamed audio data.

12. The apparatus of claim 10, wherein adjusting the volume further comprises dynamically reducing a first volume level of the plurality of audio sounds produced for the wagering game to a second volume level being less than a third volume level of the broadcast of the streamed audio data.

13. The apparatus of claim 12, wherein the processor and the memory dynamically restore the first volume level of the plurality of audio sounds produced for the wagering game upon completion of the broadcast of the streamed audio data.

14. The apparatus of claim 10, wherein the communication network comprises at least one of a wireless communication network, Bluetooth, and an Ethernet connection, and wherein the broadcast device is at least one of a server, a tuner, a smart phone, and an audio microphone, and the streamed audio data is a customized message from at least one of a gaming system administrator, a gaming system operator, and a gaming system event coordinator.

15. The apparatus of claim 10, wherein the processor and the memory temporarily pause the wagering game during the broadcast of the streamed audio data.

16. The apparatus of claim 10, wherein the processor and the memory:
provide, via a service window application of the EGM during the broadcast of the streamed audio data, information relating to a gaming tournament.

17. At least one non-transitory machine readable storage medium comprising instructions embodied thereon for ad hoc distributed real-time communication for an electronic gaming machine (EGM) comprising at least one payment acceptor in association with a plurality of EGMs in a gaming system; wherein the instructions, when executed by a processor and a memory, cause the EGM to:
receive, at each one of the plurality of EGMs, via a communication network, as a streamed audio data comprising at least one audio file from a broadcast device that was transmitted to the broadcast device as an audio signal wherein the streamed audio data is initiated using a voice command performed by a remotely located user to the plurality of EGMs and comprises voice data audibly captured as spoken by the user in real-time;
process the streamed audio data at the plurality of EGMs;
broadcast the streamed audio data using a speaker on each one of the plurality of EGMs;
dynamically adjust a volume of a plurality of audio sounds produced for a wagering game during the broadcast of the streamed audio data wherein, during the broadcast of the streamed audio data, the volume of the plurality of audio sounds produced for the wagering game is incrementally reduced through the speaker on each of the plurality of EGMs while the volume of the streamed audio data is commensurately incrementally increased through the speaker on each of the plurality of EGMs when a patron is engaging the wagering game whereas the volume of the plurality of audio sounds produced for the wagering game is muted during an idle period;
temporarily pause the wagering game during the broadcast of the streamed audio data; and
provide, via a service window application of each of the plurality of EGMs during the broadcast of the streamed audio data, information relating to a wagering game event.

18. The at least one non-transitory machine readable storage medium of claim 17, further comprising instructions that, when executed by the processor and the memory, cause the EGM to:
immediately mute, during the idle period, the volume of the plurality of audio sounds produced for the wagering game during the broadcast of the streamed audio data.

19. The at least one non-transitory machine readable storage medium of claim 18, wherein the wagering game event comprises a gaming tournament event.

20. The at least one non-transitory machine readable storage medium of claim 17, wherein the communication network comprises at least one of a wireless communication network, Bluetooth, and an Ethernet connection, and wherein the broadcast device is at least one of a server, a tuner, a smart phone, and an audio microphone, and the streamed audio data is a customized message from at least one of a gaming system administrator, a gaming system operator, and a gaming system event coordinator.

* * * * *